United States Patent
Slack et al.

(10) Patent No.: US 10,685,147 B2
(45) Date of Patent: Jun. 16, 2020

(54) NON-CONFORMANCE MAPPING AND VISUALIZATION

(71) Applicant: The Boeing Company, Chicago, IL (US)

(72) Inventors: Brian N. Slack, Lebanon, IL (US); Thomas Alexander Brown, Wentzville, MO (US); Jennifer Diane MacKay, Liberty Lake, WA (US); Guy Stockie, Snohomish, WA (US); Yanxin Emily Wang, Sammamish, WA (US); Lori Lynne Woodbury, Costa Mesa, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/056,536

(22) Filed: Feb. 29, 2016

(65) Prior Publication Data

US 2017/0249780 A1   Aug. 31, 2017

(51) Int. Cl.
*G06F 30/00* (2020.01)
*G06T 19/00* (2011.01)

(52) U.S. Cl.
CPC .............. *G06F 30/00* (2020.01); *G06T 19/00* (2013.01)

(58) Field of Classification Search
CPC ..... G06F 3/0325; G06F 3/0425; G06F 3/0346
See application file for complete search history.

(56) References Cited

U.S. PATENT DOCUMENTS

| | | | |
|---|---|---|---|
| 3,744,917 A | 7/1973 | Craig | |
| 4,815,190 A | 3/1989 | Haba et al. | |
| 4,894,908 A | 1/1990 | Haba et al. | |
| 5,023,805 A | 6/1991 | Aune | |
| 5,367,552 A | 11/1994 | Peschmann | |
| 5,544,558 A | 8/1996 | Hughes | |
| 5,771,043 A | 6/1998 | Nigawara et al. | |
| 5,822,218 A | 10/1998 | Moosa et al. | |
| 5,960,104 A | 9/1999 | Conners | |
| 6,000,610 A | 12/1999 | Talbott et al. | |

(Continued)

FOREIGN PATENT DOCUMENTS

| | | |
|---|---|---|
| CN | 1576829 A | 2/2005 |
| CN | 1609852 A | 4/2005 |

(Continued)

OTHER PUBLICATIONS

"3D reconstruction from multiple images" as "3D reconstruction", downloaded @ https://en.wikipedia.org/w/index.php?title=3D_reconstruction_from_multiple_images&oldid=628536280, posted online Oct. 6, 2014 (Year: 2014).*

(Continued)

*Primary Examiner* — Yingchun He
(74) *Attorney, Agent, or Firm* — Yee & Associates, P.C.

(57) ABSTRACT

Areas of non-conformances in a manufactured object are electronically mapped within a coordinate system of the object. Boundary lines of the areas containing the non-conformances are displayed on a 3-D image of the product. Visualization of the boundary lines of areas containing multiple non-conformances allows tracking of non-conformances, identification of trends in non-conformances and correction of production processes in order to reduce non-conformances.

20 Claims, 12 Drawing Sheets

(56) References Cited

U.S. PATENT DOCUMENTS

| | | |
|---|---|---|
| 6,167,394 A | 12/2000 | Leung et al. |
| 6,240,328 B1 | 5/2001 | LaLonde et al. |
| 6,345,207 B1 | 2/2002 | Nitta et al. |
| 6,378,387 B1 | 4/2002 | Froom |
| 6,381,506 B1 | 4/2002 | Grappone |
| 6,418,189 B1 | 7/2002 | Schafer |
| 6,477,471 B1 | 11/2002 | Hedstrom et al. |
| 6,481,096 B2 | 11/2002 | Lehmker |
| 6,487,479 B1 | 11/2002 | Nelson |
| 6,597,761 B1 | 7/2003 | Garms, III |
| 6,604,681 B1 | 8/2003 | Burke |
| 6,637,266 B1 | 10/2003 | Froom |
| 6,912,507 B1 | 6/2005 | Phillips |
| 6,941,204 B2 | 9/2005 | Halm |
| 7,042,346 B2 | 5/2006 | Paulsen |
| 7,050,894 B2 | 5/2006 | Halm et al. |
| 7,103,434 B2 | 9/2006 | Chernyak |
| 7,167,583 B1 | 1/2007 | Lipson et al. |
| 7,302,443 B2 | 11/2007 | Nakajima et al. |
| 7,333,991 B2 | 2/2008 | Hill et al. |
| 7,343,213 B1 | 3/2008 | Burgess |
| 7,353,192 B1 | 4/2008 | Ellis et al. |
| 7,365,747 B2 | 4/2008 | Finlayson et al. |
| 7,366,688 B2 | 4/2008 | Kwasniewski et al. |
| 7,644,371 B2 | 1/2010 | Robertson et al. |
| 7,646,384 B2 | 1/2010 | Anderson et al. |
| 7,650,202 B2 | 1/2010 | Strohband et al. |
| 7,804,498 B1 | 9/2010 | Graham et al. |
| 7,933,441 B2 | 4/2011 | Numata |
| 7,954,070 B2 | 5/2011 | Plocher |
| 8,027,745 B1 | 9/2011 | Freeze |
| 8,051,547 B2 | 11/2011 | Toh |
| 8,079,130 B2 | 12/2011 | Hardouin-Finez |
| 8,116,529 B2 | 2/2012 | Edwards |
| 8,352,904 B2 | 1/2013 | Hodges |
| 8,482,412 B2 | 7/2013 | Majoros et al. |
| 8,527,348 B2 | 9/2013 | Petrov |
| 8,571,951 B2 | 10/2013 | Diana et al. |
| 8,606,540 B2 | 12/2013 | Haisty et al. |
| 8,610,761 B2 | 12/2013 | Haisty et al. |
| 8,620,627 B2 | 12/2013 | Nakhle et al. |
| 8,791,823 B2 | 7/2014 | Xu |
| 8,849,636 B2 | 9/2014 | Becker |
| 8,860,760 B2 | 10/2014 | Chen |
| 8,914,149 B2 | 12/2014 | Safa-Bakhsh et al. |
| 9,110,560 B1 | 8/2015 | Senesac |
| 9,182,892 B2 | 11/2015 | Senesac |
| 9,488,592 B1* | 11/2016 | Maresca .......... G01N 21/8851 |
| 2002/0007225 A1 | 1/2002 | Costello et al. |
| 2002/0026296 A1 | 2/2002 | Lohmann |
| 2002/0071524 A1 | 7/2002 | Renkart |
| 2002/0168083 A1 | 11/2002 | Garms |
| 2002/0198764 A1 | 12/2002 | Schorno |
| 2003/0055619 A1 | 3/2003 | Singarajan |
| 2003/0055812 A1 | 3/2003 | Williams et al. |
| 2003/0074174 A1* | 4/2003 | Fu .................... G05B 19/4099 |
| | | 703/13 |
| 2003/0083794 A1 | 5/2003 | Halm |
| 2003/0120472 A1 | 6/2003 | Lind |
| 2003/0149500 A1 | 8/2003 | Faruque |
| 2003/0158702 A1 | 8/2003 | Busche et al. |
| 2004/0068350 A1 | 4/2004 | Tomson |
| 2004/0090472 A1 | 5/2004 | Risch et al. |
| 2004/0093100 A1 | 5/2004 | Gleis |
| 2004/0098151 A1 | 5/2004 | Carlucci et al. |
| 2004/0128117 A1 | 7/2004 | Crandall |
| 2004/0162651 A1 | 8/2004 | Halm |
| 2005/0044011 A1 | 2/2005 | Deal |
| 2005/0149216 A1 | 7/2005 | Popplewell |
| 2005/0223032 A1 | 10/2005 | Shan et al. |
| 2005/0228708 A1 | 10/2005 | Catala et al. |
| 2005/0278062 A1 | 12/2005 | Janert et al. |
| 2006/0106682 A1 | 5/2006 | Van Dyck et al. |
| 2006/0119601 A1 | 6/2006 | Finlayson et al. |
| 2007/0013709 A1 | 1/2007 | Charles et al. |
| 2007/0106410 A1 | 5/2007 | Bouffiou et al. |
| 2007/0106414 A1 | 5/2007 | Strohband et al. |
| 2007/0219645 A1 | 9/2007 | Thomas et al. |
| 2008/0052046 A1 | 2/2008 | Botvinnik |
| 2008/0140270 A1 | 6/2008 | Davis et al. |
| 2008/0155807 A1 | 7/2008 | Toh |
| 2008/0187897 A1 | 8/2008 | Franzen et al. |
| 2008/0205763 A1 | 8/2008 | Marsh et al. |
| 2008/0209342 A1 | 8/2008 | Taylor |
| 2008/0234850 A1 | 9/2008 | Bowling et al. |
| 2008/0252311 A1 | 10/2008 | Koh et al. |
| 2008/0270946 A1 | 10/2008 | Risch et al. |
| 2008/0276201 A1 | 11/2008 | Risch et al. |
| 2008/0294395 A1 | 11/2008 | Lu |
| 2008/0301012 A1 | 12/2008 | Cogswell et al. |
| 2009/0013281 A1 | 1/2009 | Helman et al. |
| 2009/0031236 A1 | 1/2009 | Roberston et al. |
| 2009/0112349 A1 | 4/2009 | Cobb |
| 2009/0138230 A1 | 5/2009 | Davies et al. |
| 2009/0144962 A1 | 7/2009 | Hardouin-Finez |
| 2009/0192644 A1 | 7/2009 | Meyer et al. |
| 2009/0228133 A1 | 9/2009 | Loda |
| 2009/0248545 A1 | 10/2009 | Robinson et al. |
| 2009/0312897 A1 | 12/2009 | Jamrosz et al. |
| 2010/0010794 A1 | 1/2010 | Sweers |
| 2010/0042952 A1 | 2/2010 | Geesey |
| 2010/0097195 A1 | 4/2010 | Majoros et al. |
| 2010/0114641 A1 | 5/2010 | Coffman et al. |
| 2010/0125468 A1 | 5/2010 | Avery et al. |
| 2010/0161095 A1 | 6/2010 | Lindgren |
| 2010/0175013 A1 | 7/2010 | Krauter et al. |
| 2010/0241380 A1 | 9/2010 | Cookson |
| 2010/0299304 A1 | 11/2010 | Vasudevan |
| 2011/0022208 A1 | 1/2011 | Bouffiou et al. |
| 2011/0041088 A1 | 2/2011 | Mason et al. |
| 2011/0046763 A1 | 2/2011 | Tsuchiya et al. |
| 2011/0087466 A1 | 4/2011 | Vossmann |
| 2011/0087513 A1 | 4/2011 | Floyd et al. |
| 2011/0125303 A1 | 5/2011 | Rollman et al. |
| 2011/0137443 A1 | 6/2011 | Farahani |
| 2011/0166824 A1 | 7/2011 | Hasity et al. |
| 2011/0169924 A1 | 7/2011 | Haisty et al. |
| 2011/0172795 A1 | 7/2011 | Hansen et al. |
| 2011/0251711 A1 | 10/2011 | Goel |
| 2011/0288840 A1 | 11/2011 | Kropinski et al. |
| 2011/0311097 A1* | 12/2011 | Kitagawa ............ G01N 29/069 |
| | | 382/100 |
| 2012/0007852 A1 | 1/2012 | Morate et al. |
| 2012/0030926 A1 | 2/2012 | Toh et al. |
| 2012/0050522 A1 | 3/2012 | Slyck et al. |
| 2012/0062725 A1 | 3/2012 | Charles et al. |
| 2012/0071998 A1 | 3/2012 | Davies et al. |
| 2012/0075343 A1 | 3/2012 | Chen et al. |
| 2012/0100520 A1 | 4/2012 | Jo et al. |
| 2012/0130521 A1 | 5/2012 | Kohlhoff |
| 2012/0140041 A1 | 6/2012 | Burgunder et al. |
| 2012/0154265 A1 | 6/2012 | Kim et al. |
| 2012/0249588 A1 | 10/2012 | Tison et al. |
| 2012/0303336 A1 | 11/2012 | Becker et al. |
| 2012/0304059 A1 | 11/2012 | McCloskey |
| 2012/0306666 A1 | 12/2012 | Xu et al. |
| 2013/0006409 A1 | 1/2013 | Evans et al. |
| 2013/0036031 A1 | 2/2013 | Hutchinson et al. |
| 2013/0117742 A1 | 5/2013 | Newell |
| 2013/0124150 A1 | 5/2013 | Kim et al. |
| 2013/0132373 A1 | 5/2013 | Huang et al. |
| 2013/0239330 A1 | 9/2013 | Newlin et al. |
| 2013/0261876 A1 | 10/2013 | Froom |
| 2013/0297633 A1 | 11/2013 | Edwards |
| 2014/0013263 A1 | 1/2014 | Bailiang |
| 2014/0089030 A1 | 3/2014 | Bell |
| 2014/0245206 A1 | 8/2014 | Senesac |
| 2014/0257552 A1 | 9/2014 | Senesac et al. |
| 2014/0259596 A1 | 9/2014 | Senesac et al. |
| 2014/0282183 A1 | 9/2014 | Senesac |
| 2014/0298216 A1 | 10/2014 | Prazak et al. |
| 2014/0298227 A1 | 10/2014 | Gass et al. |
| 2014/0309969 A1 | 10/2014 | Senesac et al. |
| 2014/0310629 A1 | 10/2014 | Senesac et al. |

(56) References Cited

U.S. PATENT DOCUMENTS

| | | | |
|---|---|---|---|
| 2014/0337777 A1 | 11/2014 | Senesac | |
| 2014/0365943 A1 | 12/2014 | Senesac | |
| 2014/0380215 A1 | 12/2014 | Senesac et al. | |
| 2015/0062123 A1* | 3/2015 | Yuen | G06T 19/006 345/420 |
| 2015/0134274 A1 | 5/2015 | Froom | |

FOREIGN PATENT DOCUMENTS

| | | |
|---|---|---|
| CN | 1689000 A | 10/2005 |
| CN | 1983268 A | 6/2006 |
| CN | 101174137 A | 5/2008 |
| CN | 101329624 A | 12/2008 |
| CN | 102542398 A | 7/2012 |
| CN | 102789520 A | 11/2012 |
| CN | 102799619 A | 11/2012 |
| CN | 103116818 A | 5/2013 |
| CN | 104102969 A | 10/2014 |
| DE | 102005005266 A1 | 8/2006 |
| EP | 1321869 A2 | 6/2003 |
| EP | 2052807 A1 | 4/2009 |
| EP | 2431915 A2 | 3/2012 |
| EP | 2458562 A1 | 5/2012 |
| EP | 2790136 A1 | 10/2014 |
| GB | 2327289 A | 1/1999 |
| JP | H10254941 A | 9/1998 |
| JP | 10269292 A | 10/1998 |
| JP | 2004206352 A | 7/2004 |
| JP | 2007095039 A | 4/2007 |
| JP | 2008288852 A | 11/2008 |
| JP | 201153999 A1 | 9/2011 |
| JP | 2012039544 A | 2/2012 |
| JP | 2012104124 A | 5/2012 |
| JP | 2012526979 A | 11/2012 |
| JP | 2013505637 A | 2/2013 |
| WO | 0049544 A2 | 8/2000 |
| WO | 2008143148 A1 | 11/2008 |
| WO | 2008144797 A1 | 12/2008 |
| WO | 2011056196 A1 | 5/2011 |
| WO | 2012166545 A2 | 12/2012 |
| WO | 2013061156 A2 | 5/2013 |
| WO | 2013078156 A1 | 5/2013 |
| WO | 2013078265 A1 | 5/2013 |

OTHER PUBLICATIONS

Final Office Action, dated Jan. 25, 2016, regarding U.S. Appl. No. 13/780,109, 54 pages.
Office Action, dated Jan. 15, 2016, regarding U.S. Appl. No. 13/798,964, 36 pages.
Final Office Action, dated Feb. 9, 2016, regarding U.S. Appl. No. 13/835,262, 32 pages.
Office Action, dated Mar. 28, 2016, regarding U.S. Appl. No. 13/835,262, 21 pages.
Office Action, dated Jan. 15, 2015, regarding U.S. Appl. No. 13/861,678, 37 pages.
European Patent Office Communication, dated Jan. 26, 2016, regarding Application No. 14159760.9, 5 pages.
Notices of Reasons for Rejection and English Translation, dated Jan. 29, 2016, regarding Japanese Patent Application No. 2014-060864, 7 pages.
Final Office Action, dated May 6, 2016, regarding U.S. Appl. No. 13/861,678, 33 pages.
Extended European Search Report, dated Jun. 17, 2016, regarding Application No. EP15176304.2, 9 pages.
Office Action, dated Jul. 27, 2016, regarding U.S. Appl. No. 13/785,616, 59 pages.
Notice of Allowance, dated Jun. 24, 2016, regarding U.S. Appl. No. 13/835,262, 19 pages.
Office Action, dated Jul. 8, 2016 regarding U.S. Appl. No. 14/467,706, 94 pages.
Notice of Allowance, dated Oct. 4, 2016, regarding U.S. Appl. No. 13/798,964, 51 pages.
Office Action, dated Oct. 3, 2016, regarding U.S. Appl. No. 13/890,347, 60 pages.
Final Office Action, dated Oct. 20, 2016, regarding U.S. Appl. No. 13/785,616, 43 pages.
Final Office Action, dated Oct. 13, 2016, regarding U.S. Appl. No. 14/467,706, 28 pages.
Canadian Intellectual Property Office Examination Search Report, dated Aug. 29, 2016, regarding Application No. 2,839,914, 6 pages.
Japanese Preliminary Examination Report, dated Aug. 5, 2016, regarding Application No. 2014-060864, 9 pages.
European Patent Office Examination Report, dated Oct. 14, 2016 regarding Application No. 14160787.9, 6 pages.
International Search Report and Written Opinion, dated Apr. 25, 2014, regarding Application No. PCT/US2014/010912, 10 pages.
International Preliminary Report on Patentability, dated Sep. 1, 2015, regarding Application No. PCT/US2014/010912, 6 pages.
Extended European Search Report, dated Jun. 2, 2014, regarding Application No. 14160787.9, 6 pages.
"Notice from the European Patent Office dated Oct. 1, 2007 concerning business methods," Official Journal EPO, dated Nov. 2007, pp. 592-593.
Extended European Search Report, dated Jul. 17, 2014, regarding Application No. 14162481.7, 5 pages.
Extended European Search Report, dated Jul. 23, 2014, regarding Application No. 14157597.7, 7 pages.
European Patent Office Communication, dated Sep. 15, 2015, regarding Application No. 14157597.7, 7 pages.
Extended European Search Report, dated Aug. 22, 2014, regarding Application No. EP14159832.6, 9 pages.
Extended European Search Report, dated Sep. 30, 2014, regarding Application No. EP14159760.9, 6 pages.
Notices of Reasons for Rejection and English Translation, dated Sep. 8, 2015, regarding Japanese Patent Application No. 2014-060864, 5 pages.
Kokogawa et al., "Wide-Area Contents Distribution based on Cooperation among Digital Libraries," Information Processing Academic Society Research Report, Mar. 10, 2000, vol. 2000, No. 26, pp. 83-88.
International Search Report and Written Opinion, dated Nov. 19, 2014, regarding Application No. PCT/US2014/011196, 10 pages.
International Search Report and Written Opinion, dated Dec. 1, 2014, regarding Application No. PCT/US2014/031030, 9 pages.
Extended European Search Report, dated Dec. 3, 2014, regarding Application No. 14170988.1, 7 pages.
Australian Government Patent Examination Report No. 1, dated Mar. 18, 2015, regarding Application No. 2014200514, 4 pages.
Australian Government Patent Examination Report No. 2, dated Jul. 8, 2015, regarding Application No. 2014200514, 3 pages.
Australian Government Patent Examination Report No. 3, dated Aug. 13, 2015, regarding Application No. 2014200514, 4 pages.
Canadian Intellectual Property Office Examination Search Report, dated Mar. 24, 2015, regarding Application No. 2,840,798, 6 pages.
Australian Government Patent Examination Report No. 1, dated Mar. 27, 2015, regarding Application No. 2014200292, 3 pages.
Australian Government Patent Examination Report No. 2, dated Jul. 30, 2015, regarding Application No. 2014200292, 5 pages.
Canadian Intellectual Property Office Examination Search Report, dated Apr. 15, 2015, regarding Application No. 2,839,913, 4 pages.
Australian Government Patent Examination Report No. 1, dated May 13, 2015, regarding Application No. 2014200304, 4 pages.
Australian Government Patent Examination Report No. 2, dated Oct. 29, 2015, regarding Application No. 2014200304, 4 pages.
Canadian Intellectual Property Office Examination Search Report, dated Feb. 17, 2015, regarding Application No. 2,839,914, 6 pages.
Canadian Intellectual Property Office Examination Search Report, dated Oct. 28, 2015, regarding Application No. 2,839,914, 5 pages.
Extended European Search Report, dated Nov. 18, 2015, regarding Application No. EP14159752.6, 6 pages.
Non-Patent Literature including images from the website www.aso.com, as published on Jan. 16, 2013 based on captures in the Internet Archive tool referred to as the WayBackMachine, http://web.archive.

(56) References Cited

OTHER PUBLICATIONS org/web/20130116040904/http://www.aso.com/ ("NPL1"), Final Office Action dated Mar. 27, 2015, 3 pages.
"Marianna Airmotive Uses a FARO Laser Tracker to Reduce Repair Turnaround Time dramatically," Mar. 7, 2015, 2 pages. http://www.mariannaairmotive.com.
"What's New in SolidWorks," SolidWorks, Version 2010, 199 pages. http://files.solidworks.com/Supportfiles/Whats_new/2010/English/whatsnew.pdf.
Office Action, dated Dec. 17, 2014, regarding U.S. Appl. No. 13/780,109, 37 pages.
Final Office Action, dated Mar. 27, 2015, regarding U.S. Appl. No. 13/780,109, 18 pages.
Office Action, dated Sep. 17, 2015, regarding U.S. Appl. No. 13/780,109, 47 pages.
Office Action, dated Jul. 24, 2015, regarding U.S. Appl. No. 13/785,616, 55 pages.
Office Action, dated Feb. 26, 2015, regarding U.S. Appl. No. 13/858,364, 32 pages.
Notice of Allowance, dated Apr. 13, 2015, regarding U.S. Appl. No. 13/858,364, 5 pages.
Office Action, dated Feb. 27, 2015, regarding U.S. Appl. No. 13/834,893, 41 pages.
Notice of Allowance, dated Jun. 22, 2015, regarding U.S. Appl. No. 13/834,893, 24 pages.
Office Action, dated Mar. 4, 2015, regarding U.S. Appl. No. 13/855,102, 28 pages.
Final Office Action, dated Jun. 26, 2015, regarding U.S. Appl. No. 13/855,102, 18 pages.
Notice of Allowance, dated Nov. 6, 2015, regarding U.S. Appl. No. 13/855,102, 20 pages.
Office Action, dated Apr. 23, 2015, regarding U.S. Appl. No. 13/798,964, 39 pages.
Office Action, dated Sep. 21, 2015, regarding U.S. Appl. No. 13/835,262, 41 pages.
Office Action, dated Aug. 14, 2015, regarding U.S. Appl. No. 13/890,347, 44 pages.
Final Office Action, dated Nov. 20, 2015, regarding U.S. Appl. No. 13/890,347, 38 pages.
Office Action, dated May 5, 2015, regarding U.S. Appl. No. 13/861,678, 48 pages.
Final Office Action, dated Sep. 4, 2015, regarding U.S. Appl. No. 13/861,678, 27 pages.
Office Action, dated May 6, 2015, regarding U.S. Appl. No. 13/852,063, 39 pages.
Final Office Action, dated Oct. 22, 2015, regarding U.S. Appl. No. 13/852,063, 30 pages.
Office Action, dated Sep. 29, 2015, regarding U.S. Appl. No. 13/860,126, 34 pages.
Office Action, dated Jun. 29, 2015, regarding U.S. Appl. No. 13/922,411, 43 pages.
Final Office Action, dated Jul. 31, 2015, regarding U.S. Appl. No. 13/922,411, 23 pages.
Senesac, "Nonconformance Visualization System," U.S. Appl. No. 13/798,964, filed Mar. 13, 2013, 84 pages.
Prazak et al., "visualization of an Object Using a Visual Query System," U.S. Appl. No. 15/003,802, filed Jan. 22, 2016, 49 pages.
Final Office Action, dated Dec. 2, 2015, regarding U.S. Appl. No. 13/785,616, 38 pages.
Roh et al., "An object-based 3D walk-through model for interior construction progress monitoring", May 3, 2010, Elsevier, Automation in construction 20, pp. 66-75.
Extended European Search Report, dated Feb. 7, 2017, regarding Application No. 14725826.3, 8 pages.
State Intellectual Property Office of PRC Notification of First Office Action, dated Nov. 30, 2016, regarding Application No. 201480025761.0, 11 pages.
Office Action, dated Mar. 23, 2017, regarding U.S. Appl. No. 13/785,616, 35 pages.
Notice of Allowance, dated May 1, 2017, regarding U.S. Appl. No. 13/890,347, 25 pages.
Final Office Action, dated Apr. 20, 2017, regarding U.S. Appl. No. 13/861,678, 23 pages.
Office Action, dated Mar. 31, 2017, regarding U.S. Appl. No. 13/922,411, 31 pages.
Notice of Allowance, dated Sep. 7, 2017, regarding U.S. Appl. No. 13/785,616, 28 pages.
Final Office Action, dated Jul. 19, 2017, regarding U.S. Appl. No. 13/922,411, 23 pages.
Notice of Allowance, dated Sep. 13, 2017, regarding U.S. Appl. No. 13/890,347, 22 pages.
European Patent Office Examination Report, dated Jun. 28, 2017, regarding Application No. 14702979.7, 7 pages.
Japanese Notice of Reasons for Rejection and English translation, dated Apr. 10, 2018, regarding Application No. 2014081733, 6 pages.
Japanese Notice of Reasons for Rejection, English Translation, dated Apr. 16, 2018, regarding Application No. 2016541961, 8 pages.
European Office Action, dated May 31, 2018, regarding Application No. 14160787.9, 10 pages.
Japanese Notice of Reasons for Rejection and English translation, dated Jan. 9, 2018, regarding Application No. 2015560178, 8 pages.
State Intellectual Property Office of China, Notification of First Office action, dated Nov. 3, 2017, regarding Application No. 2014102817178, 2 pages.
Office Action, dated Mar. 13, 2018, regarding U.S. Appl. No. 15/003,802, 111 pages.
China National Intellectual Property Administration Notification of First Office Action with English Translation, dated Nov. 23, 2018, regarding Application No. 201510524813.5, 20 pages.
China National Intellectual Property Administration Notification of Second Office Action with English Translation, dated Dec. 12, 2018, regarding Application No. 201410123178.5, 28 pages.
Japanese Notice of Reasons for Rejection with English Translation, dated Jan. 23, 2019, regarding Application No. 2015-162749, 4 pages.
Office Action, dated Dec. 14, 2016, regarding U.S. Appl. No. 13/861,678, 29 pages.
European Patent Office Communication and Extended Search Report, dated Feb. 14, 2019, regarding Application No. 18205193.8, 7 pages.
The State Intellectual Property Office of the P.R.C. First Office Action and Search Report with English Translation, dated Apr. 2, 2019, regarding Application No. 2014101448284, 14 pages.
Final Office Action, dated Jul. 27, 2018, regarding U.S. Appl. No. 15/003,802, 27 pages.
Office Action, dated Jun. 22, 2018, regarding U.S. Appl. No. 14/267,706, 33 pages.
Notice of Allowance, dated Oct. 15, 2018, regarding U.S. Appl. No. 15/003,802, 12 pages.
Final Office Action, dated Dec. 18, 2018, regarding U.S. Appl. No. 14/467,706, 24 pages.
Notice of Allowance, dated Feb. 21, 2019, regarding U.S. Appl. No. 15/003,802, 17 pages.
Notice of Allowance, dated Apr. 24, 2019, regarding U.S. Appl. No. 14/467,706, 14 pages.

\* cited by examiner

MULTIPLE LARGE AREA DEFECT MAPPING COORDINATE FORM

| MODEL: 787 | NICO ID: | | | | 91 | NCO KEY: | |
|---|---|---|---|---|---|---|---|
| LINE # | DEFECT: PAINT RUN 96 90 | | | | | COMMENTS | |
| POINT | X COORDS | | Y COORDS | | Z COORDS | ADD BUTTON | |
| 1 | X1 | 22.09 | Y1 | 12.38 | Z1 | 3.94 | |
| 2 | X2 | 26.92 | Y2 | 76.90 | Z2 | 2.67 | |
| 3 | X3 | 76.99 | Y3 | 13.84 | Z3 | 6.95 | |
| 4 | X4 | 46.90 | Y4 | 7.95 | Z4 | 84.20 | |
| 5 | | | | | | | |
| 6 | | | | | | | |
| 7 | | | | | | | |
| 8 | | | | | | | |
| 9 | | | | | | | |

NON-CONFORMANCE MAPPING AND VISUALIZATION

CROSS REFERENCE TO RELATED APPLICATIONS

This application is related to the following US patent applications: "Object Visualization System," Ser. No. 13/780,109, filed Feb. 28, 2013, now U.S. Pat. No. 10,061,481; "Shop Order Status Visualization System," Ser. No. 13/785,616, filed Mar. 5, 2013, now U.S. Pat. No. 9,870,444; "Nonconformance Visualization System," Ser. No. 13/798,964, filed Mar. 13, 2013, now U.S. Pat. No. 9,612,725; "Condition of Assembly Visualization System Based on Build Cycles," Ser. No. 13/835,262, filed Mar. 15, 2013, now U.S. Pat. No. 9,492,900; "Locator System for Three-Dimensional Visualization," Ser. No. 13/855,102, filed Apr. 2, 2013, now U.S. Pat. No. 9,292,180; "Aircraft Comparison System," Ser. No. 13/860,126, filed Apr. 10, 2013, now U.S. Pat. No. 9,340,304; "Nonconformance Visualization System", Ser. No. 13/861,678, filed Apr. 12, 2013, now U.S. Pat. No. 10,481,768; "Shop Order Status Visualization System," Ser. No. 13/890,347 filed May 9, 2013, now U.S. Pat. No. 9,880,694; "Aircraft Comparison System with Synchronized Displays," Ser. No. 13/922,411, filed Jun. 20, 2013 now U.S. Pat. No. 10,067,650; "Visualization of an Object Using a Visual Query System," Ser. No. 13/852,063, filed Mar. 28, 2013, now abandoned; "Serial Number Control Visualization System," Ser. No. 14/467,706, filed Aug. 25, 2014, now U.S. Pat. No. 10,416,857; "Visualization of an Object Using a Visual Query System," Ser. No. 15/003,802 filed Jan. 22, 2016, now U.S. Pat. No. 10,331,295, all assigned to the same assignee, and incorporated herein by reference.

BACKGROUND INFORMATION

1. Field

The present disclosure generally relates to systems for tracking non-conformances in manufactured objects, and deals more particularly with a system for mapping and visualizing areas on the object containing multiple non-conformances.

2. Background

In production environments, manufactured products may be produced along a line of stations or shops where individualized manufacturing or assembly operations are performed. During these operations, non-conformances may occur in the object for any of a number of reasons. In some cases, non-conformances can be corrected, or future non-conformances can be avoided by tracking the non-conformances and modifying production processes and/or equipment accordingly.

For example, during the production of commercial aircraft, aircraft assemblies are moved from shop-to-shop on a factory floor and assembled according to a predetermined installation plan. Individual non-conformances may be captured and recorded by personnel at each shop, so that personnel in subsequent shops are made generally aware of existing non-conformances, and may take steps to correct them. Currently, shop floor personnel manually record individual non-conformances using non-standard text formatting and/or spreadsheets in which the general location of non-conformances are noted. However, this method is not integrated with other data sources such as part drawings, specifications, etc. and does not record the exact location of the defect in terms of absolute X,Y,Z coordinates that allow a non-conformance to be readily located. Consequently, in some cases, repair work to correct non-conformances is unintentionally covered up, in turn resulting in the need for substantial rework, and associated repair costs. Moreover, the current method does not permit identification of large areas containing multiple non-conformances that require rework.

SUMMARY

The disclosed embodiments provide a system for mapping and visualizing non-conformances on a manufactured object or structure, such as an aircraft, or a group of objects such as a fleet of aircraft. The system provides a user with a dashboard view on electronic display and is capable of processing large amounts of non-conformance records from source data systems. Source data may include aircraft control codes, and installation plans used in the production of aircraft. The dashboard displays an image of the aircraft along with the point locations of non-conformances which are mapped onto the image. The system may include a 3-D visualization program capable of displaying a 3-D image of the aircraft down to the part level, and showing the non-conformance record status, age and location of non-conformances.

The system may employ commercially available dashboard software tools. The system interfaces with these tools and selected data systems to display various types of information required by a user in connection with the production of aircraft or other objects or products. Using the spatial coordinates of each non-conformance, the system generates a 3-D outline or boundary of the shape and size of an area containing multiple non-conformances, including the contours of the area. The 3-D image showing the point locations of each of the non-conformances, and the boundaries of the area containing the non-conformances, is stored for future use in connection with production of other aircraft and tracking non-conformance trends.

According to one disclosed embodiment, a method is provided of mapping and visualizing non-conformances on an object. The method comprises determining a location of each of the non-conformances on the object and using a processor to generate an electronic record containing spatial coordinates of the non-conformances within a 3-D coordinate system. The method further comprises using a processor to calculate boundaries of an area on the object containing the non-conformances based on the spatial coordinates contained in the electronic record, and generating an electronic image of the object, including displaying the boundaries of the area containing the non-conformances to allow visualization of the area containing the non-conformances. Generating the electronic record is performed by generating a 3-D electronic display of the object, selecting points on the 3-D electronic display respectively corresponding to the locations of the non-conformances, and using a programmed computer to convert the points selected on the 3-D electronic display into the spatial coordinates within the 3-D coordinate system. Selecting points on the 3-D electronic display includes moving a cursor to locations on the electronic display corresponding to the locations of the non-conformances on the object, and selecting the locations on the electronic display based on the location of the cursor. Generating includes scanning the object using a feature scanner, using a processor to generate a set of data points defined by X,Y,Z coordinates representing a surface of the object, and using a processor to convert the data points to the 3-D electronic display. Generating the 3-D electronic display may be performed by using a programmed computer to derive a 3-D digital model of the object from a 3-D CAD file and generating the electronic record includes using a processor to compute X,Y,Z coordinates of the points on the 3-D electronic display respectively corresponding to the locations of the non-conformances. Displaying the electronic image with boundaries of the area containing the non-conformances is performed at any of a plurality of stations where work is performed on the object. The 3-D coordinate system is a coordinate system of the object. Determining the location of each of the non-conformances on the object may be performed using a machine vision system to locate each of the non-conformances on the object.

According to another disclosed embodiment, a method is provided of visualizing an area of non-conformances in a manufactured object comprising generating a 3-D electronic display of the object, and selecting points on the 3-D electronic display respectively corresponding to locations of the non-conformances on the object. The method also includes using a programmed computer to convert each of the points on the 3-D electronic display into a set of coordinates defining the locations of the non-conformances within a coordinate system of the object. The method further includes using a programmed computer to calculate boundaries of an area containing the non-conformances based on the set of coordinates, and generating an electronic image of the object, including displaying the boundaries of the area containing the non-conformances to allow a user to visualize the area containing the non-conformances. Generating the 3-D electronic display is performed using a programmed computer to access a 3-D CAD file representing a model of the object, and generating the 3-D electronic display may be performed using a 3-D point cloud generated by scanning the object. Generating the electronic image of the object includes displaying the electronic image in 3-D, and displaying contours of the boundaries. The method may further comprise using a programmed computer to generate an electronic record for the object that contains a set of coordinates, and entering information into the electronic record uniquely identifying the object and types of non-conformances.

According to another disclosed embodiment, a manufacturing method is provided, comprising identifying non-conformances on each of a plurality of substantially identical manufactured objects, and using a programmed computer to generate an electronic record for each of the objects, including entering into each of the records spatial locations of non-conformances on the object. The method further comprises using a processor to map the non-conformances on each of the objects using the electronic records, and displaying an electronic image of one of the objects, including displaying boundary lines of areas containing non-conformances for each of the objects. The method may also include modifying at least one process used to manufacture the objects based on the boundary lines. Displaying the electronic image includes superimposing the boundary lines on the image. The method may also include determining an area containing the non-conformances of all of the objects based on the boundary lines displayed on the image, and reworking the non-conformances within the area. Entering spatial locations of non-conformances on the object includes entering coordinates of each of the non-conformances in a 3-D coordinate system of the object.

According to still another disclosed embodiment, a system is provided for tracking non-conformances of aircraft occurring during production. The system comprises a programmed computer, at least one electronic display coupled with the computer for displaying a 3-D image of the aircraft, and an electronic file accessible by the computer and containing a 3-D model of the aircraft. The system further comprises an input device coupled with the computer and configured to allow a user to input non-conformances based on the 3-D image on the electronic display, and a software program. The software program is accessible by the computer, and includes a routine for mapping the spatial locations of the non-conformances in 3-D, and a routine for calculating boundaries of a 3-D area containing the non-conformances to allow visualization on the display of non-conformances within the boundaries.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and advantages thereof, will best be understood by reference to the following detailed description of an illustrative embodiment of the present disclosure when read in conjunction with the accompanying drawings, wherein:

in FIG. 9.

DETAILED DESCRIPTION

Figure 1:
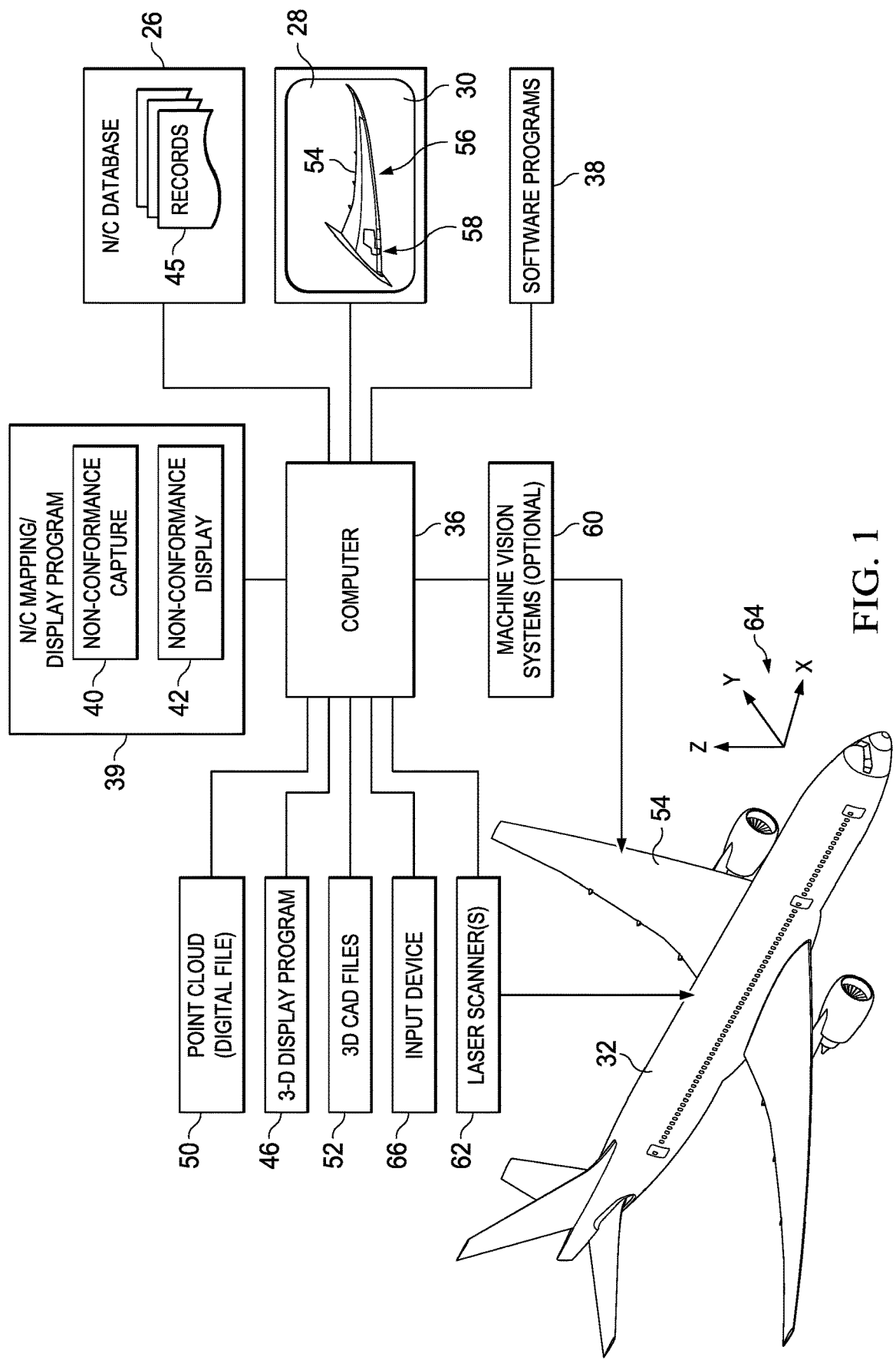
FIG. 1 is an illustration of a block diagram broadly showing functional components of a system for mapping and visualizing non-conformances on an aircraft or other object, wherein an aircraft is shown in perspective.

Referring first to FIG. 1, the disclosed embodiments provide a production non-conformance visualization system 20 (hereafter "PNVS") for mapping and visualizing non-conformances on a manufactured object, such as, for example and without limitation, an aircraft 32. As used herein "non-conformance" and "non-conformances" refer to parts or areas of the aircraft 32 that are out-of-tolerance, or exhibit inconsistencies and/or may not meet performance or aesthetic requirements. The PNVS 20 is capable of both mapping the non-conformances and displaying electronic 3-D images 56 that show the boundaries of areas 58 on the aircraft 32 containing one or more non-conformances, and optionally, the point locations of each of the non-conformances.

Figure 2:
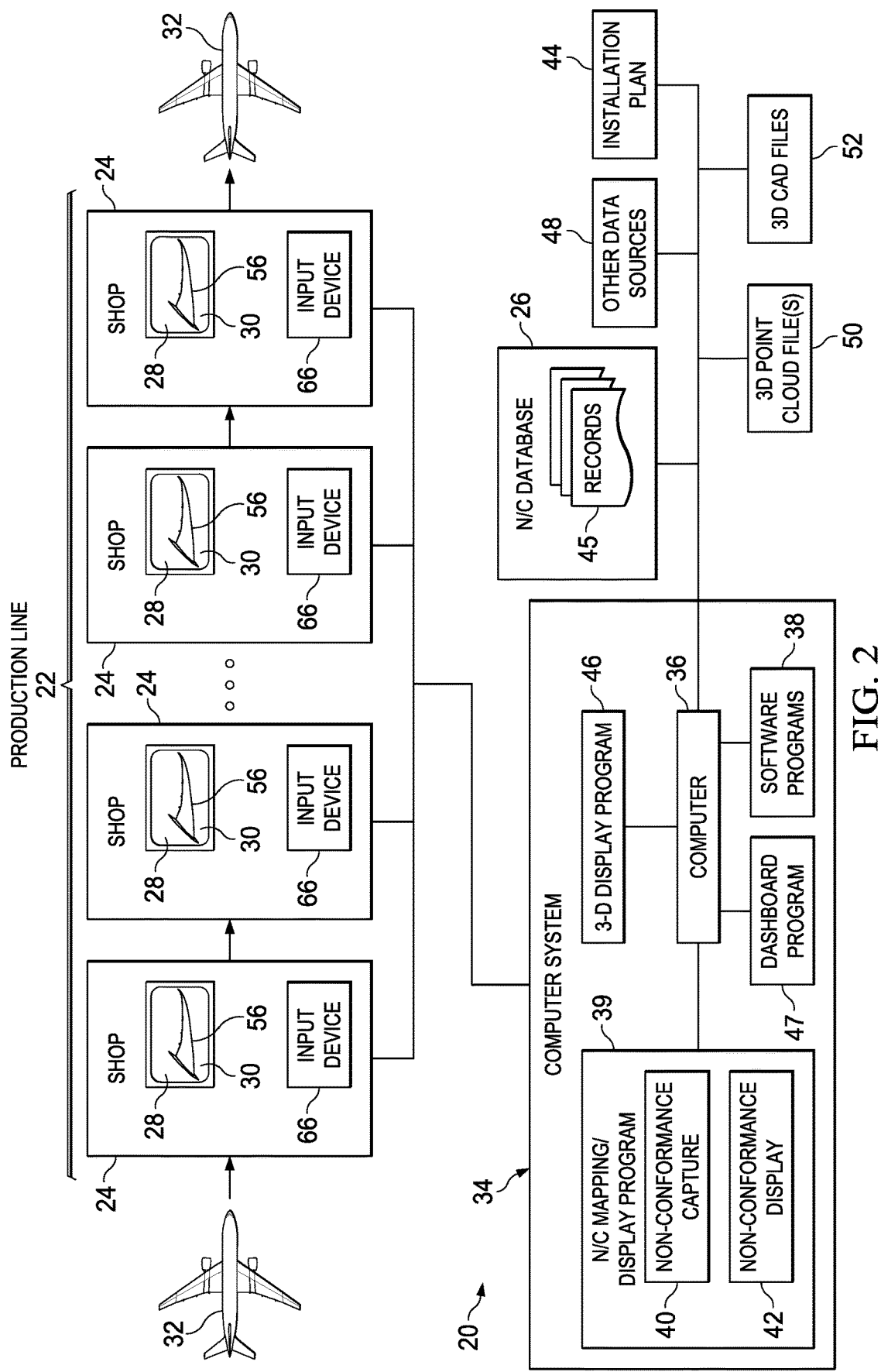
FIG. 2 is an illustration of a functional block diagram of the system shown in FIG. 1, utilized in an aircraft production line environment.

Referring now to FIGS. 1 and 2, in one exemplary application, the PNVS 20 may be employed in connection with a production line 22 in which aircraft 32 pass through a series of shops 24 (FIG. 2) or production stations where various production operations are performed on the aircraft 32, such as, without limitation, machining, assembly, testing, painting, etc., according to a predefined aircraft installation plan 44. The shops 24 may be located in a single facility such as a factory (not shown), or in multiple facilities.

Each of the shops 24 may include one or more electronic display screens 30 such as a flat screen monitor or tablet (not shown), and other data processing components, including, for example and without limitation, an input device 66 such as a keyboard or touch screen (both not shown). The shops 24 are networked with a computer system 34 and various electronic databases and files, including but not limited to a non-conformance database 26, 3-D point cloud files 50, 3-D CAD files 52, and other data sources 48 which may comprise information for various models of the aircraft 32, quality control records, statistical information, etc.

The computer system 34 may comprise a central computer system, or a distributed system in which hardware, firmware or software implemented parts of the computer system 34 are located within one or more of the shops 24, or elsewhere. The computer system 34 includes one or more programmed computers 36 or similar data processors controlled by one or more software programs 38. The computer system 34 also includes a 3-D display program 46 capable of displaying electronic 3-D images 56 on any of the display screens 30, and a non-conformance mapping and display program 39 capable of capturing, mapping and displaying areas of non-conformances on the 3-D images 56. As will be discussed later in more detail, the non-conformance mapping and display program 39 may include a non-conformance capture routine 40 and a non-conformance display routine 42. A commercially available dashboard display program 47 including a graphical user interface (GUI) may also be employed to provide a dashboard type display on the display screen 30.

The computer system 34 may have access to a variety of data sources 48, the aircraft installation plan 44, the 3-D display program 46, 3-D point cloud files 50, 3-D CAD files 52 and the non-conformance database 26 for multiple aircraft 32, such as an aircraft fleet. The non-conformance database 26 comprises a plurality of electronic records 45, wherein each of the electronic records contains information uniquely identifying a particular aircraft and the spatial coordinates of non-conformances on that aircraft 32 within the three-dimensional coordinate system 64 of the aircraft 32.

The data sources 48 may include various types of data generated at each of the shops 24, such as quality control data and historical data for a fleet of aircraft, etc. The 3-D CAD files 52 may include, for example and without limitation, solid models of parts and assemblies for multiple types of aircraft 32 which may be called up to display various sections and parts of the aircraft 32. Alternatively, the computer system 34 may have access to 3-D point cloud files 50 that represent surfaces on the aircraft 32 which are derived from scanning surfaces of the aircraft 32 using laser scanners 62 (FIG. 1) or other types of feature capture devices. As will be discussed below, non-conformances may be identified either through visual inspection by personnel in any of the shops 24, or by using one or more optional machine vision systems 60 which may detect non-conformances as well as provide the spatial locations of the non-conformances within the three dimensional coordinate system 64 of the aircraft 32.

Figure 3:
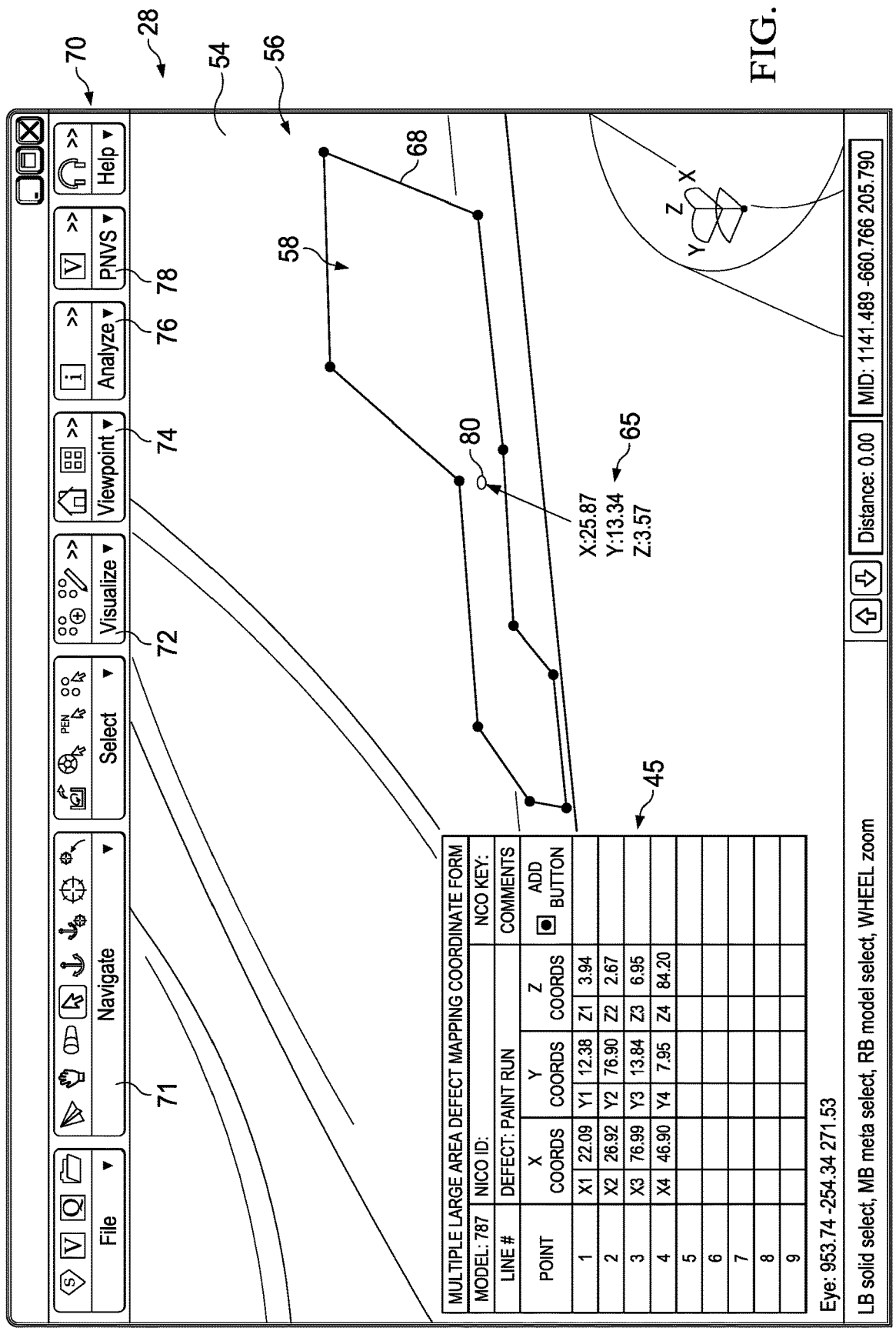
FIG. 3 is an illustration of a screenshot of an electronic display, showing a dashboard display view of a section of an aircraft wing containing an area of non-conformances.
Figure 4:
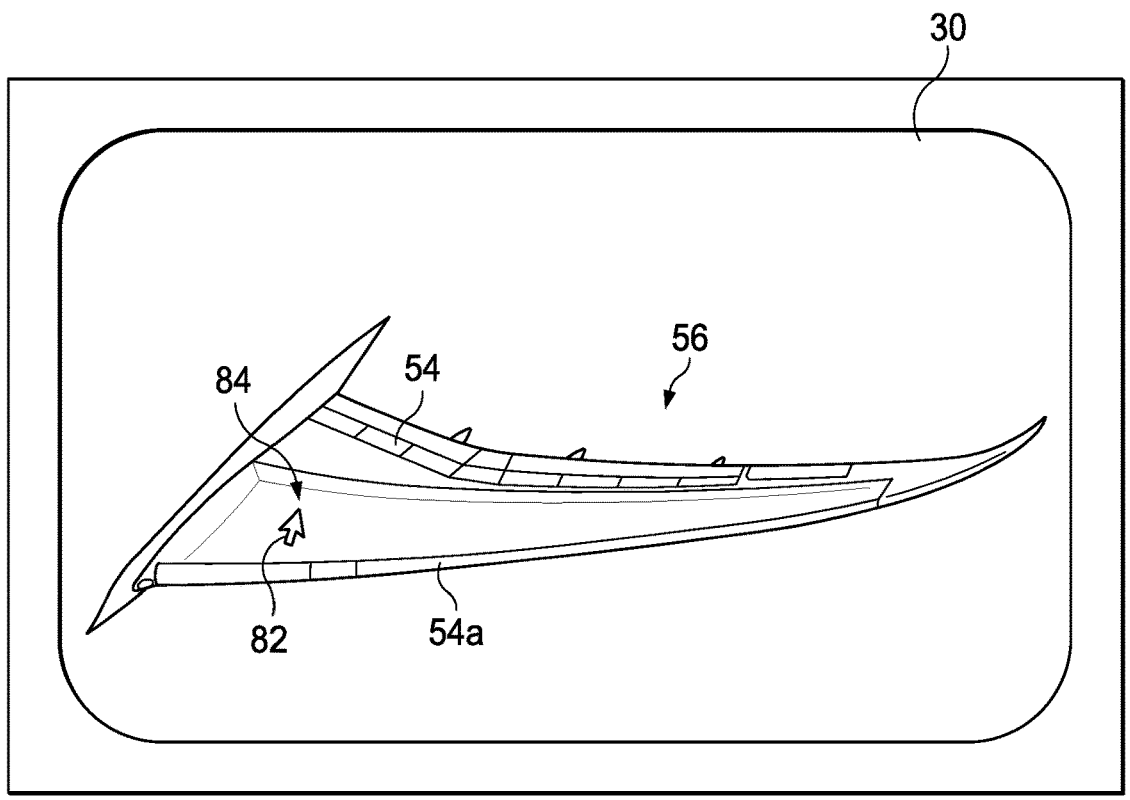
FIG. 4 is an illustration of an electronic display screen showing a 3-D perspective view of an aircraft wing, a cursor having been moved to a location on the wing containing a non-conformance.

As previously discussed, the PNVS 20 allows a user to map non-conformances on a section of the aircraft 32, such as a wing 54, and then visualize areas 58 of the wing 54 that contain those multiple non-conformances. Referring to FIG. 3, an electronic dashboard display 28 may be called up by a user on one of the display screens (FIGS. 1 and 2) to view sections of the aircraft 32, such as the wing 54. The dashboard display 28 includes a toolbar 70 that may be customized for the particular application, and allows the user to view and call up 3-D models of the aircraft 32, including parts and sections thereof, and to use the PNVS 20 to display an area 58 of the wing 54 containing multiple non-conformances. For example, the toolbar 70 may include navigation tools 71, visualization tools 72, tools 74 allowing the user to select various image viewpoints, analyzing tools 76 and a tool 78 for calling up the PNVS 20. In one embodiment, coordinates 65 may be automatically displayed based on a point location 80 on the 3-D image 56 selected by moving a cursor (see FIG. 4) to that location on the display screen 30. Also, an electronic record 45 form may be displayed, showing the coordinates of the point locations of non-conformances within the area 58 surrounded by the displayed boundary 68.

The dashboard display 28 may also be employed by the user to select point locations of the non-conformances on the wing 54. For example, referring to FIG. 4, an electronic 3-D image 56 of the wing 54 may be called up on the dashboard display 28 and rotated as desired in order to show a desired section 84 of the wing 54. The image 56 may be generated from the 3-D CAD files (FIGS. 1 and 2), or alternatively the image 56 may be generated from point cloud files 50 produced by scanning the aircraft 32 with a laser or other type of scanner 62. In one embodiment, the user moves a selector such as a tablet pen or cursor 82 to the wing section 84 on the 3-D image 56 where a non-conformance is known to exist, based on a visual inspection of the wing. Using the cursor 82, the user selects a point location 80 on the displayed wing section 84. In response to the selection, the non-conformance capture routine 42 generates and enters the X,Y,Z coordinates of the selected point location 80 into an electronic record 45 (see FIG. 8) for the particular aircraft 32 being mapped.

Figures 8, 9, 10:
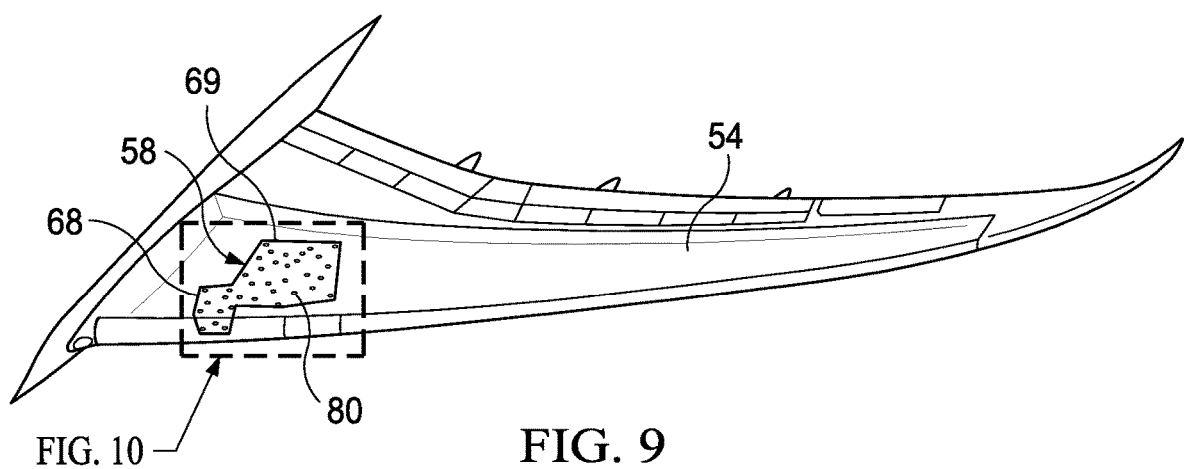
FIG. 8 is an illustration of an electronic record form containing the spatial coordinates of each of a plurality of non-conformances.
FIG. 9 is an illustration similar to FIG. 6 but showing a boundary line having been computer generated and drawn around the area containing the non-conformances.
FIG. 10 is an illustration of the area designated as "FIG. 10.
Figure 10:
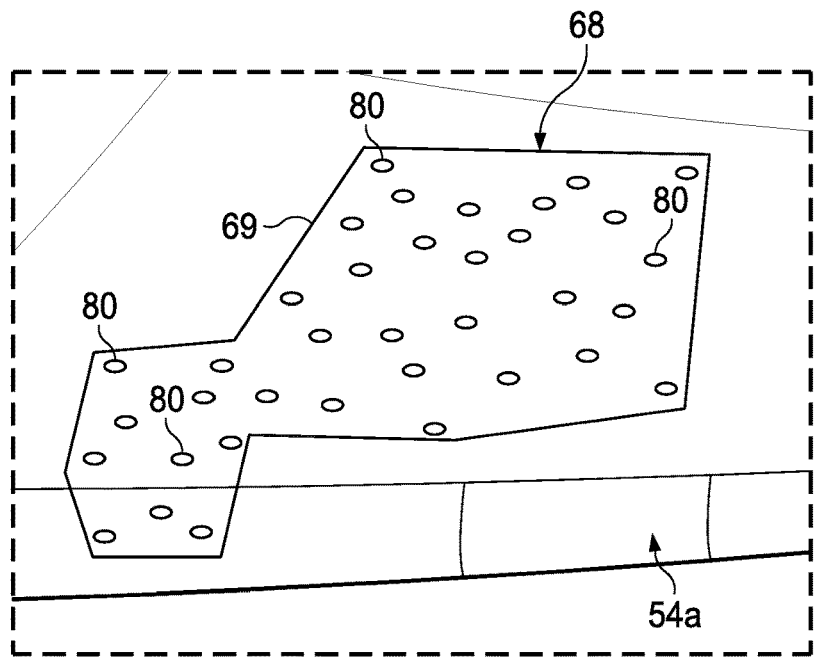

FIG. 8 illustrates the fields of one typical form of an electronic record 45 containing the X, Y, and Z coordinates 96 for a group of non-conformance location points 94 selected by a user. The non-conformance capture routine 40 (FIG. 2) automatically populates the electronic record 45 form with the coordinates 96 for each of the location points 94 as they are selected by the user on an image 56 displayed on the display screen 30. The electronic record 45 may have various other fields useful in describing areas or types of non-conformances, and associating them with other information, such as the model number 88 of the aircraft 32, the ID # (identification number) 89 of the particular set of non-conformances contained in the electronic record 45, a description of the non-conformance type 90, comments 92, and a non-conformance work order 91 (NCO) which may be used to associate several groups of non-conformances that may be related to each other.

Figure 5:
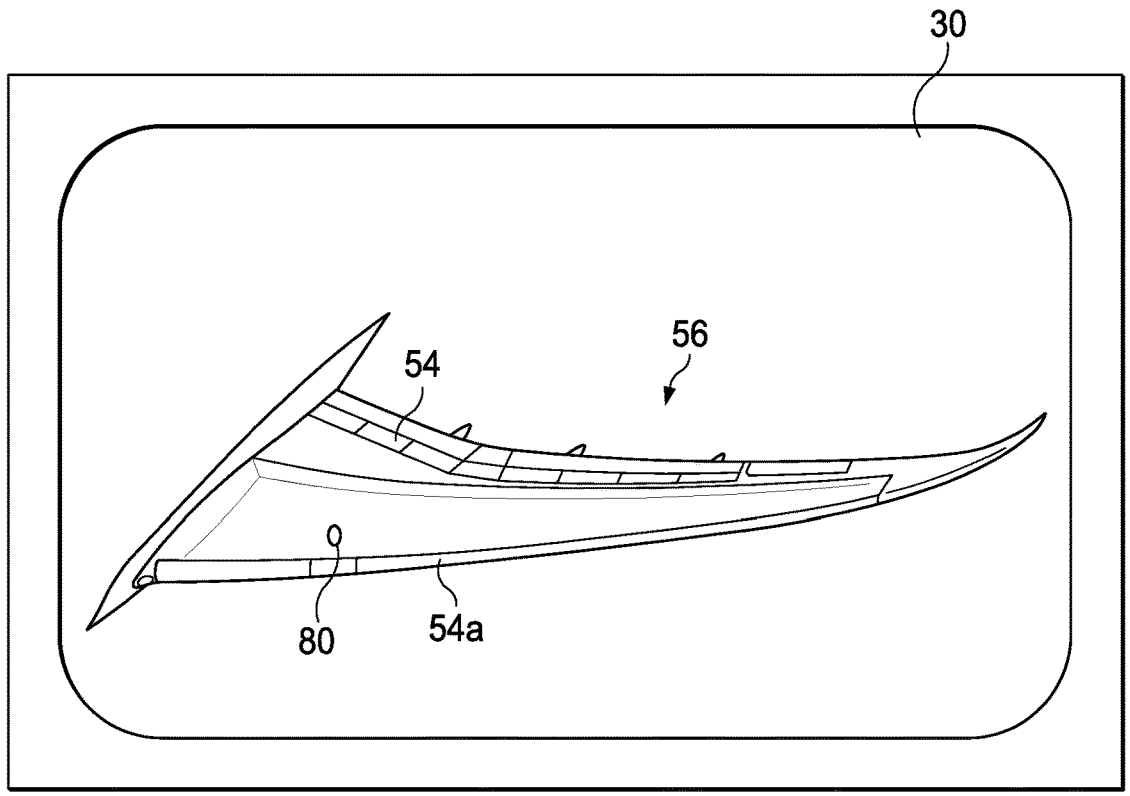
FIG. 5 is an illustration similar to FIG. 4 but showing the location of a non-conformance selected at the location shown in FIG. 4.
Figure 6:
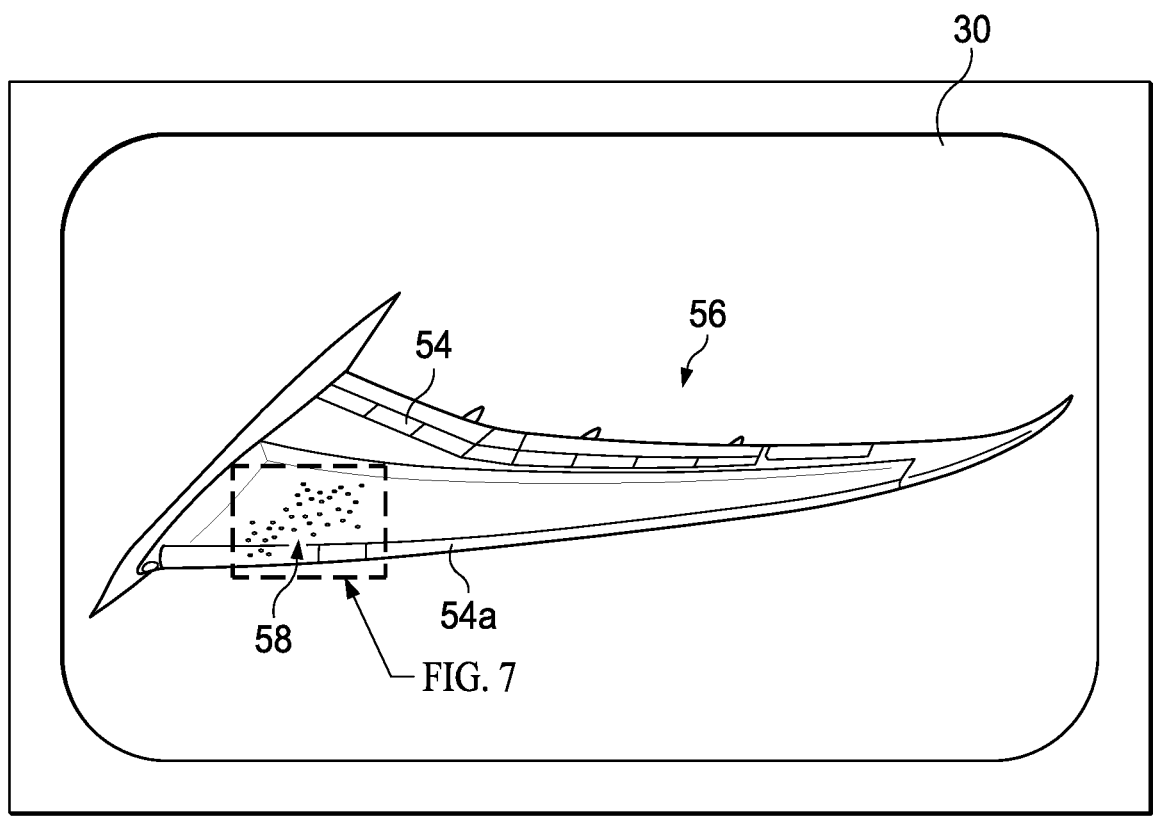
FIG. 6 is an illustration similar to FIG. 5, but showing a plurality of non-conformances in a wide area of the wing having been selected and displayed.
Figure 7:
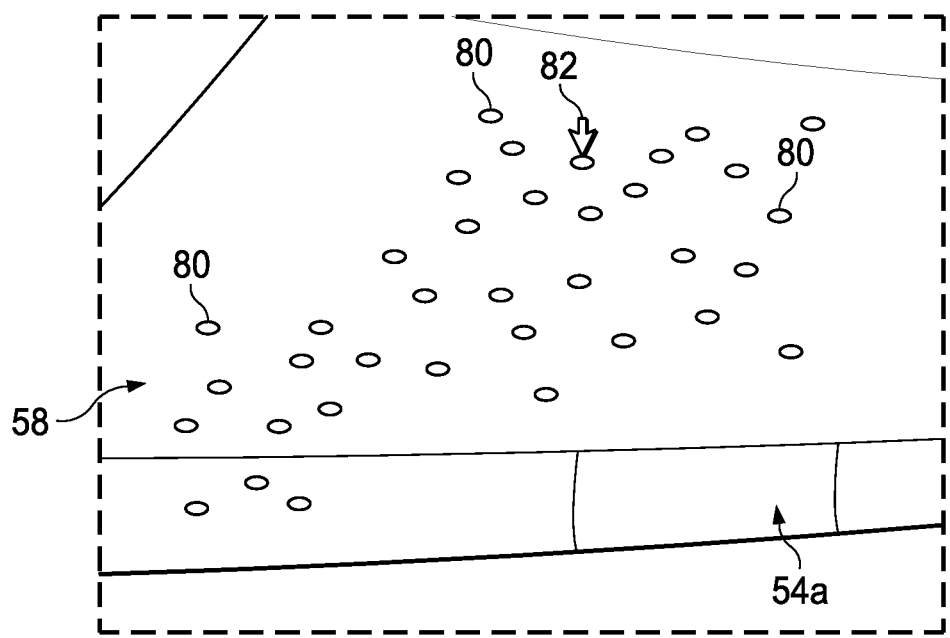
FIG. 7 is an illustration of the area designated as "FIG. 7" in FIG. 6.

Referring now to FIG. 5, upon selection of a point location 80 of the non-conformance on the wing section 84, the point location 80 is displayed on the image 56. Referring to FIGS. 6 and 7, the process of selecting the point locations 80 of non-conformances on the wing section 84, and the automatic electronic entry of the X,Y,Z coordinates of these locations into the electronic record 45 is continued until the coordinates 96 (FIG. 8) of all of the non-conformances within the wing section 84 have been entered into the electronic record 45.

Referring now to FIGS. 9 and 10, when the user has completed entering the point locations 80 of all of the non-conformances into the electronic record 45, the non-conformance display routine 42 calculates three dimensional outer boundaries 68 of the area 58 containing the point locations 80 of the non-conformances, and displays a corresponding boundary line 69 in 3-D on the 3-D image 56. Displaying the boundaries 68 in 3-D permits contours of the areas 58 containing non-conformances to be visualized. In the case of the example shown in FIGS. 9 and 10, it can be seen that the displayed boundaries 68 extend fore and aft over a curved section of the wing 54 and down onto a curved leading edge 54a of the wing 54.

Figure 11:
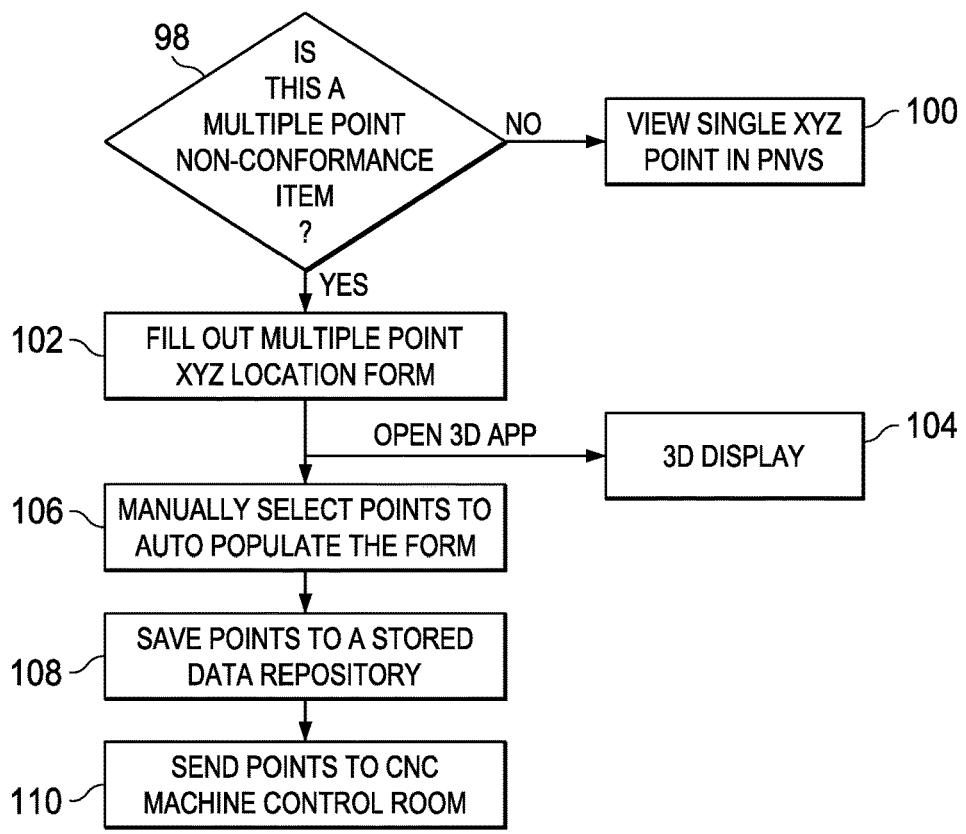
FIG. 11 is an illustration of a flow diagram of a routine forming part of a software program for capturing and mapping non-conformances.

FIG. 11 is a software flow diagram broadly illustrating the operations performed by the non-conformance capture routine 40 (FIG. 2). Beginning at 98, a determination is made of whether there is more than one non-conformance to be captured in a section 84 of the aircraft 32 under consideration. If the non-conformance item is not a multi-point non-conformance to be captured, i.e it is a single point, then at 100 a single point location including the X,Y,Z coordinates of the point are displayed by the PNVS 20 on the electronic 3-D display screen 30. If, however, the non-conformance item comprises non-conformances at multiple location points, then the electronic record 45 form is displayed on the display screen 30 and the user may fill in the fields of an electronic record 45 form, identifying the model of the aircraft, a description of the non-conformance type, comments, etc.

Next, the 3-D display program 46 (FIGS. 1 and 2) is opened and a 3-D image of a desired section 84 of the aircraft 32 is displayed at 104. At 106, the user manually selects point locations on the 3-D image of the aircraft 32 displayed at 104, and the electronic record 45 form is automatically populated with the X, Y, and Z coordinates of each of the selected points as the points are selected by the user. At 108, the electronic record 45, including the X, Y, and Z coordinates of the non-conformances, is saved by the user, e.g. by pressing a "save" button (not shown), and stored to a data repository such as an electronic memory for future recall and use in analyzing and/or correcting non-conformances. For example, at 110, the electronic record 45, including the non-conformance location points, may be sent to a computer numeric controlled (CNC) control room where a program controlling a CNC machine such as a robotic spray painter, is modified to reduce or eliminate future non-conformances.

Figure 12:
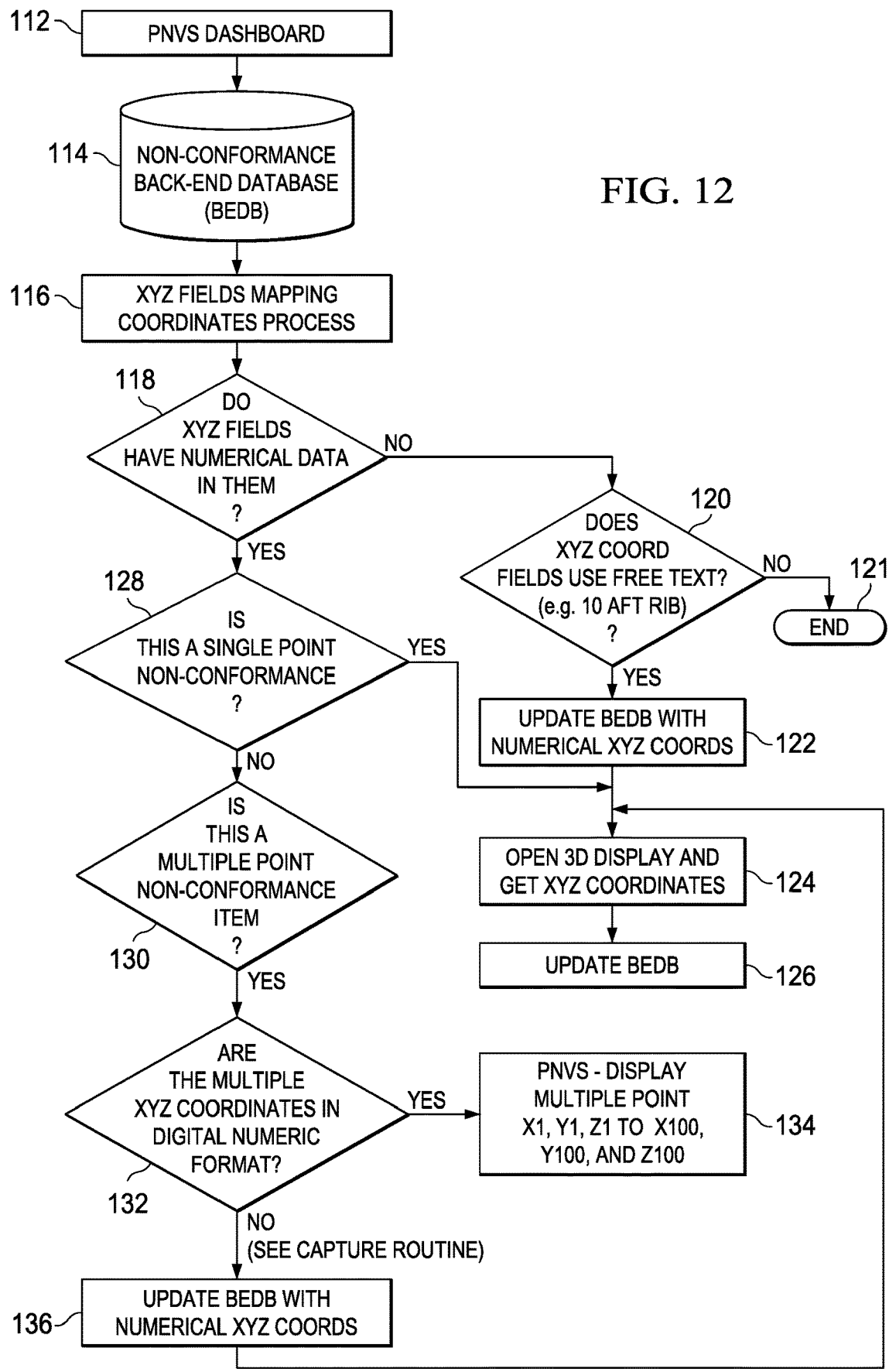
FIG. 12 is an illustration of a flow diagram of a routine forming part of the software program for displaying the mapped non-conformances.

FIG. 12 is a software flow diagram broadly illustrating the operations performed by the non-conformance display routine 42 (FIGS. 1 and 2). Beginning at 112, the PNVS dashboard display 28 is called up and connected to backend databases ("BEDB") which may include installation plans 44, 3-D CAD files 52, other stored data sources 48, as well as the non-conformance database 26 (FIG. 1) which contains the non-conformance records 45. At 114 non-conformance records stored in a back-end database, e.g. non-conformance database 26 (FIG. 1), such as groups of non-conformances, may be retrieved. At 116, the X,Y,Z coordinates in the coordinate fields 96 (FIG. 8) of the electronic records 45 are mapped. At 118 the X,Y,Z fields 96 are evaluated to determine whether they contain numerical coordinate data, i.e. coordinate values. If the X,Y,Z fields 96 do not contain numerical values, then at 120, a determination is made of whether these fields contain free text that identifies the spatial locations of non-conformances. For example, in the case of the aircraft 32, an X,Y,Z field 96 may contain a notation of "10 AFT Rib" which is interpreted by the routine 42 to mean that non-conformances are present on the number 10 aft rib of the aircraft 32.

If the X,Y,Z field 96 does not contain either coordinate values or free text that identifies spatial locations on the aircraft 32, then the examination of the X,Y,Z field 96 ends at 121. If however, the X,Y,Z fields 96 contain free text that define the spatial locations of non-conformances, then the backend databases are updated with the X,Y,Z coordinates of those spatial locations. Next, at 124, the 3-D display is opened and the X,Y,Z coordinates of the non-conformances are retrieved, allowing the 3-D display to display a 3-D image of the aircraft 32 showing the locations of the non-conformances at 126. Also, the backend databases are updated based on the X,Y,Z coordinates used to display the image of the aircraft 32.

If the X,Y,Z field contains free text that identifies the spatial location of a non-conformance, then at 122, the backend databases previously mentioned are updated with the X,Y,Z coordinate values corresponding to the spatial locations defined by the free text. Next, at 124, the 3-D display is opened on the dashboard display 28, and the X,Y,Z coordinates are used to display the spatial location of a non-conformance located at these coordinates. As the spatial locations of each of the non-conformances are displayed, the backend databases are updated with the X,Y,Z coordinates of the displayed non-conformance, as shown at 126.

Returning now to 118, if the X,Y,Z field 96 contains numerical data, i.e. the X,Y,Z coordinates of one or more non-conformance, then at 128, a determination is made of whether the numerical data represents a single point non-conformance or multipoint (multiple) conformances. If the numerical data represents a single point non-conformance, then the location of that non-conformance is shown on the image 56 of the aircraft on the 3-D display at 124. If, however, it is confirmed at 130 that the numerical data represents a multipoint non-conformance, then at 132 a determination is made of whether the multiple X,Y,Z coordinates are in digital numerical format. If it is confirmed that the multiple X,Y,Z coordinates are in digital numerical format, then at 134 the area 58, including its boundaries 68, are displayed on the 3-D image 56, and optionally the X, Y and Z coordinates of the non-conformances within the area 58 are also displayed along with the image 56 on the display screen 30. If, however, it is confirmed that the multiple X,Y,Z coordinates are not in digital numerical form at 132, then the backend databases are updated with the numerical X,Y,Z coordinates of the non-conformances and they are displayed at 124.

Figure 13:
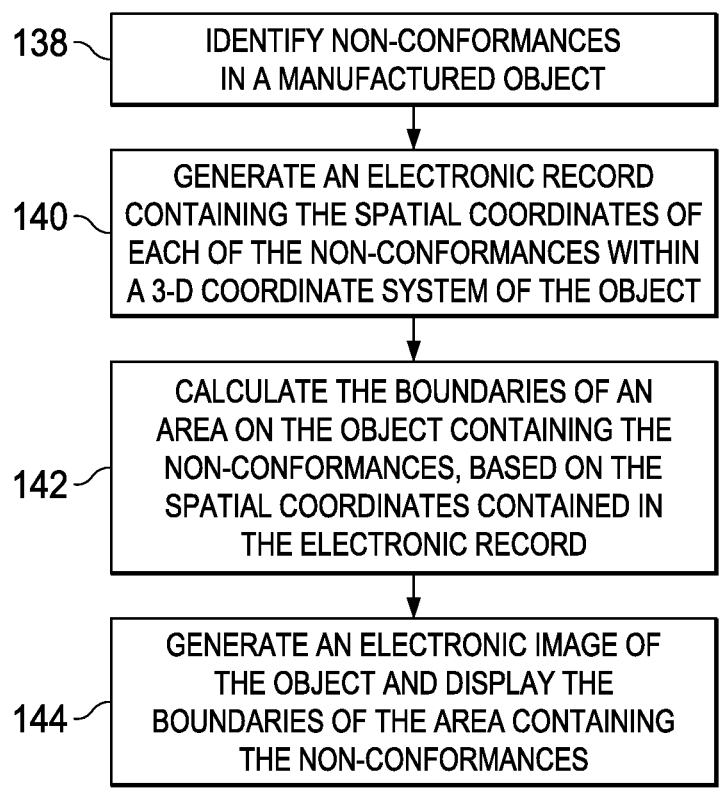
FIG. 13 is an illustration of a flow diagram of a method for visualizing an area of non-conformances on an object.

FIG. 13 broadly illustrates the overall steps of a method of mapping and visualizing areas of non-conformances on an object, such as the aircraft 32 previously described. Beginning at 138, non-conformances in the object (e.g. the aircraft 32) are identified, either by visual inspection or by using automated equipment such as machine vision systems. At 140, an electronic record 45 is generated containing the spatial locations of each of the non-conformances within a 3-D coordinate system of the object. At 142, the boundaries 68 of an area 58 of the object containing the identified non-conformances are calculated based on the spatial locations contained in the electronic record 45. At 144, an electronic image 56 of the object is generated, and the boundaries 68 of the area 58 containing the non-conformances are displayed on the 3-D image 56. Based on the boundaries 68 that are displayed, production equipment or processes may be altered to automatically correct or rework the non-conformances, or to avoid future non-conformances.

Figure 14:
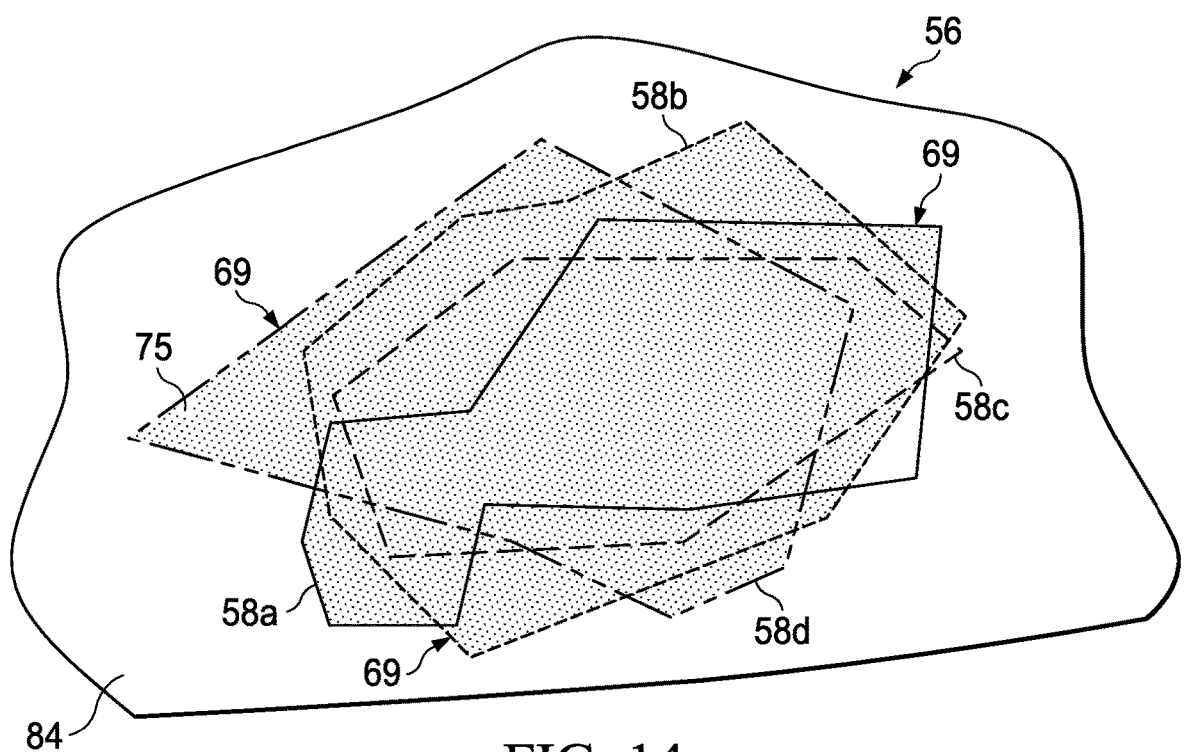
FIG. 14 is an illustration of a perspective view of a wing section, showing superimposed boundary lines of areas containing non-conformances for a group of essentially identical aircraft.
Figure 15:
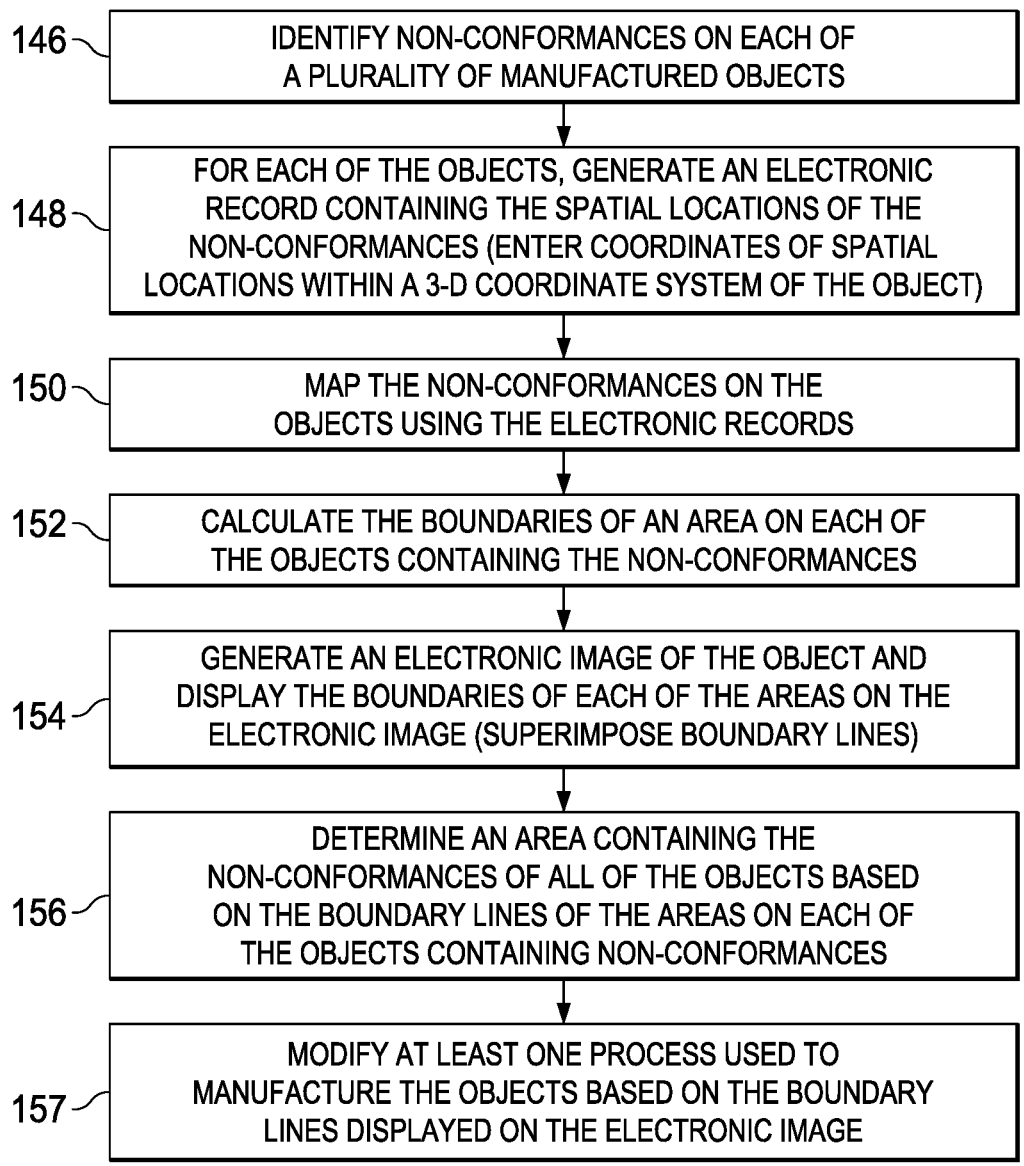
FIG. 15 is an illustration of a flow diagram of a manufacturing method.

Referring now to FIGS. 14 and 15, the PNVS 20 may be employed to map and visualize non-conformance areas 58 on a group of substantially identical manufactured objects, such as a fleet of aircraft 32. The PNVS 20 permits technicians to compare areas of non-conformances for different ones of aircraft 32 in a group or fleet, as well as to analyze trends in non-conformances. Based on comparison of the areas for different ones of the aircraft 32 in a group, adjustments may be made in one or more production processes and/or production equipment which reduce or eliminate future non-conformances, or which allow any necessary rework to be carried out more efficiently and/or effectively. Following these adjustments, the non-conformances may be reworked or corrected.

Figure 14A:
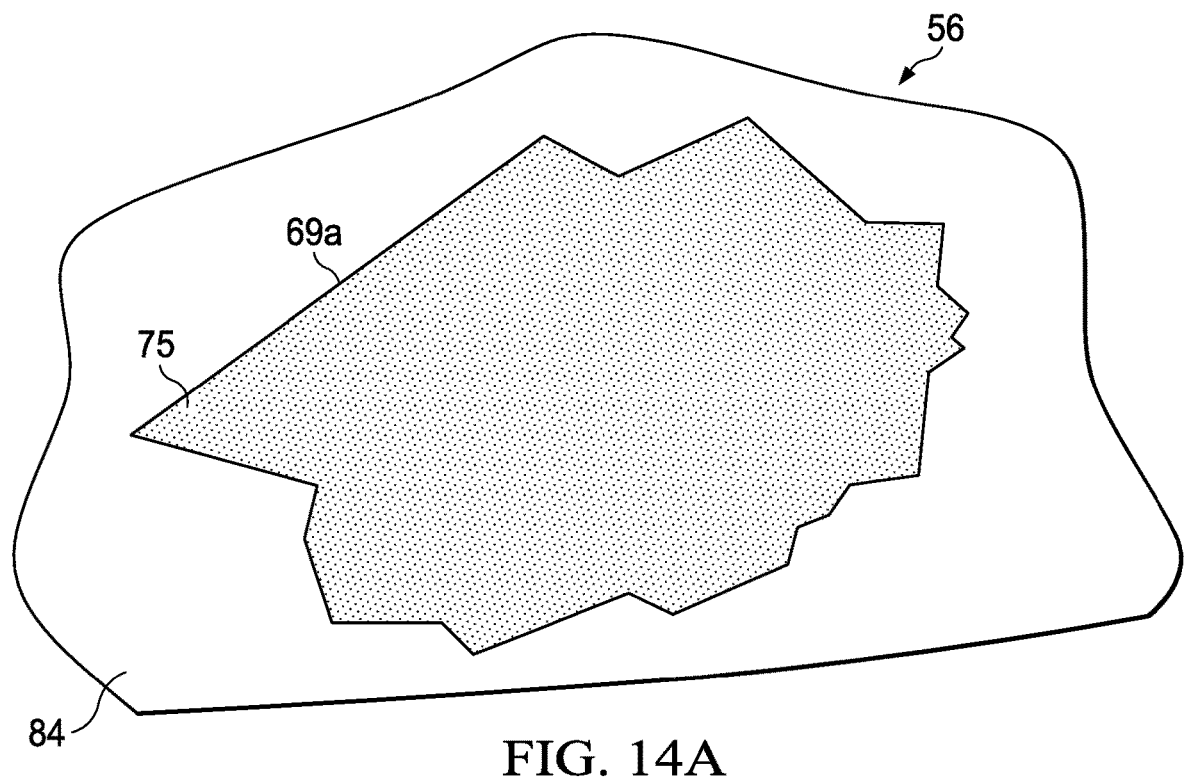
FIG. 14A is an illustration similar to FIG. 14 but showing the outer boundary line of the combined areas of non-conformances of the aircraft.

FIG. 14 represents a 3-D image 56 of a wing section 84 in which the boundary lines 69 are shown for each of the areas 58a, 58b, 58c, 58d of non-conformances respectively for a plurality of substantially identical manufactured objects, such as a group or fleet of aircraft 32. The boundary lines 69 of the areas 58a-58d for the different aircraft 32 may be superimposed on the 3-D image 56 of one of the aircraft 32. By visualizing areas 58 of non-conformances for a group of objects, the areas of overlap of the boundary lines 69 for the areas 58a-58d, indicated by the shaded area 75 in FIG. 14A can be visualized. Moreover, as shown in FIG. 14A, an outer boundary line 69a of the combined areas 58a-58d may be calculated and displayed on the image 56 to allow technicians to make appropriate changes in production processes and/or or equipment, such as, for example and without limitation, reprogramming automated equipment such as robots.

FIG. 15 broadly illustrates the steps of a production method, that includes mapping and visualizing non-conformances for a group of objects, such as a fleet of aircraft as previously described in connection with FIG. 14. At 146, non-conformances are identified on each of a plurality of substantially identical manufactured objects. At 148, for each of the manufactured objects, an electronic record 45 is generated that contains the spatial locations of the non-conformances within the coordinate system of the object. At 150, the non-conformances on the objects are mapped using the electronic records 45. At 152, outer boundaries 68 are calculated of an area 58 on each of the objects that contains non-conformances. At 154, an electronic image 56 of the object is generated, and the boundary lines 69 of each of the areas 58 on the electronic image 56 containing non-conformances are displayed. The boundary lines 69 of the areas 58 may be superimposed on the electronic image 56. At 157, at least one process used to manufacture the objects is modified based on the boundaries 68 displayed on the electronic image 56. Following the modification, the non-conformances within the boundaries 68 may be reworked or corrected.

Figure 16:
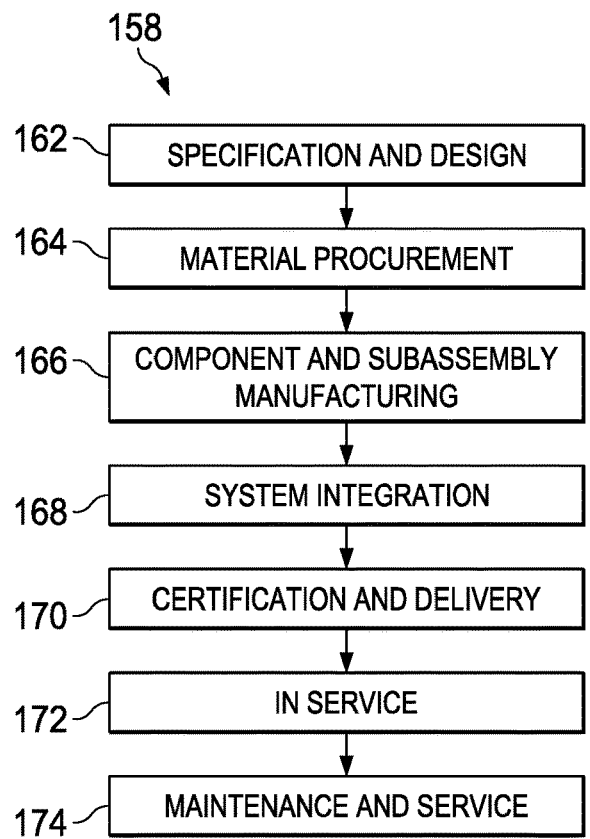
FIG. 16 is an illustration of a flow diagram of aircraft production and service methodology.
Figure 17:
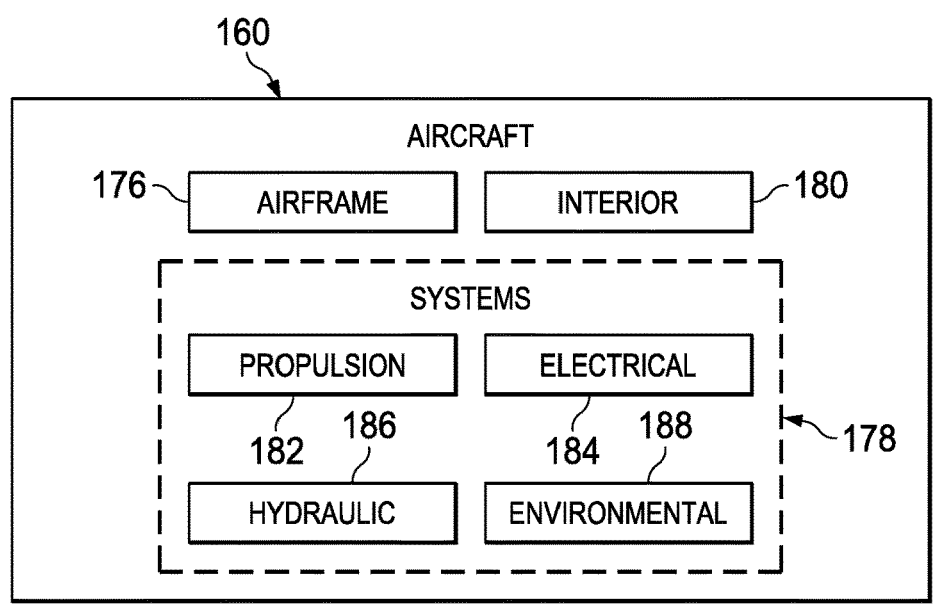
FIG. 17 is an illustration of a block diagram of an aircraft.

Embodiments of the disclosure may find use in a variety of potential applications, particularly in the transportation industry, including for example, aerospace, marine, automotive applications and other application where objects, projects, or structures are manufactured, such as, without limitation, an aircraft. Thus, referring now to FIGS. 16 and 17, embodiments of the disclosure may be used in the context of an aircraft manufacturing and service method 158 as shown in FIG. 16 and an aircraft 160 as shown in FIG. 17. Aircraft applications of the disclosed embodiments may include, for example, without limitation, production operations which may result in non-conformances or variations, such as, without limitation, painting an aircraft. During pre-production, exemplary method 158 may include specification and design 162 of the aircraft 160 and material procurement 164. During production, component and subassembly manufacturing 166, and system integration 168 of the aircraft 160 take place. Thereafter, the aircraft 160 may go through certification and delivery 170 in order to be placed in service 172. While in service by a customer, the aircraft 160 is scheduled for routine maintenance and service 174, which may also include modification, reconfiguration, refurbishment, and so on.

Each of the processes of method 158 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 17, the aircraft 160 produced by exemplary method 158 may include an airframe 176 with a plurality of systems 178 and an interior 180. Examples of high-level systems 178 include one or more of a propulsion system 182, an electrical system 184, a hydraulic system 186 and an environmental system 188. Any number of other systems may be included. Although an aerospace example is shown, the principles of the disclosure may be applied to other industries, such as the marine and automotive industries.

Systems and methods embodied herein may be employed during any one or more of the stages of the production and service method 158. For example, components or subassemblies corresponding to production process 166 may be fabricated or manufactured in a manner similar to components or subassemblies produced while the aircraft 160 is in service. Also, one or more apparatus embodiments, method embodiments, or a combination thereof may be utilized during the production stages 166 and 168, for example, by substantially expediting assembly of or reducing the cost of an aircraft 160. Similarly, one or more of apparatus embodiments, method embodiments, or a combination thereof may be utilized while the aircraft 160 is in service, for example and without limitation, to maintenance and service 174.

As used herein, the phrase "at least one of", when used with a list of items, means different combinations of one or more of the listed items may be used and only one of each item in the list may be needed. For example, "at least one of item A, item B, and item C" may include, without limitation, item A, item A and item B, or item B. This example also may include item A, item B, and item C or item B and item C. The item may be a particular object, thing, or a category. In other words, at least one of means any combination items and number of items may be used from the list but not all of the items in the list is required.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different advantages as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

The invention claimed is:

1. A method of mapping and visualizing non-conformances on a plurality of substantially identical objects, comprising:
   for each object in the plurality of substantially identical objects:
      determining, using a detection apparatus, a location of each of a plurality of non-conformances on the object;
      generating an electronic record, by a processor, containing spatial coordinates of the plurality of non-conformances within a 3-D coordinate system; and
      calculating boundaries, by the processor, of an area on the object containing the plurality of non-conformances based on the spatial coordinates contained in the electronic record;
   generating a 3-D electronic image of one object in the plurality of substantially identical objects; and
   displaying, on a display device, simultaneously the boundaries of all of the areas of all of the objects in the plurality of substantially identical objects containing the plurality of non-conformances for all of the objects in the plurality of substantially identical objects superimposed on the 3-D electronic image of the one object to allow simultaneous visualization of all of the areas of all of the objects in the plurality of substantially identical objects containing the plurality of non-conformances for all of objects in the plurality of substantially identical objects.

2. The method of claim 1, wherein generating the electronic record for each object in the plurality of substantially identical objects comprises selecting points on a 3-D electronic display of the object by moving a cursor to locations on the electronic display corresponding to the locations of the non-conformances on the object, and selecting the locations on the electronic display based on the location of the cursor.

3. The method of claim 1, wherein generating the 3-D electronic image of the one object in the plurality of objects includes:
   scanning the one object using a feature scanner;
   generating a set of data points, by the processor, defined by X, Y, and Z coordinates representing a surface of the one object; and
   converting the data points, by the processor, to the 3-D electronic image.

4. The method of claim 1, wherein generating the 3-D electronic image of the one object includes using a computer to derive a 3-D digital model of the one object from a 3 D computer aided design file.

5. The method of claim 1, wherein generating the electronic record for each object in the plurality of objects includes computing X, Y, and Z coordinates, using the processor, of points on a 3-D electronic display of the object respectively corresponding to the locations of the non-conformances.

6. The method of claim 1, wherein displaying the boundaries of the areas containing the plurality of non-conformances for the plurality of substantially identical objects superimposed on the 3-D electronic image is performed at any of a plurality of stations where work is performed on an object in the plurality of objects.

7. The method of claim 1, wherein the 3-D coordinate system is a coordinate system of the object.

8. The method of claim 1, wherein determining the location of each of the non-conformances on the object includes using a machine vision system to locate each of the non-conformances on the object.

9. A method of visualizing areas of non-conformances in a plurality of substantially identical manufactured objects, comprising:
   for each manufactured object in the plurality of substantially identical manufactured objects:
      detecting, using a detection apparatus, locations of a plurality of substantially identical non-conformances on the manufactured object;
      converting, using a processor, the locations of the plurality of non-conformances into a set of coordinates within a coordinate system of the manufactured object; and
      calculating, using the processor, boundaries of an area containing the plurality of non-conformances using the set of coordinates; and
   generating an electronic image of one manufactured object in the plurality of substantially identical manufactured objects, including displaying simultaneously the boundaries of all of the areas of all of the manufactured objects in the plurality of substantially identical manufactured objects containing the plurality of non-conformances for all of the manufactured objects in the plurality of substantially identical manufactured objects superimposed on the electronic image of the one manufactured object to allow a user to simultaneously visualize all of the areas of all of the manufactured objects in the plurality of substantially identical manufactured objects containing the plurality of non-conformances for all of the manufactured objects in the plurality of substantially identical manufactured objects.

10. The method of claim 9, wherein generating the electronic image of the one manufactured object is performed using a programmed computer to access a 3-D computer aided design file representing a model of the one manufactured object.

11. The method of claim 9, wherein generating the electronic image of the one manufactured object is performed using a 3-D point cloud generated by scanning the one manufactured object.

12. The method of claim 9, wherein generating the electronic image of the one manufactured object includes:
   displaying the electronic image in 3-D; and
   displaying contours of the boundaries.

13. The method of claim 9, further comprising, for each manufactured object in the plurality of substantially identical manufactured objects:
   generating an electronic record, by a programmed computer, for the manufactured object containing the set of coordinates; and
   entering information into the electronic record uniquely identifying the manufactured object and types of non-conformances.

14. A manufacturing method, comprising:
   identifying, using a detection apparatus, a plurality of non-conformances on each of a plurality of substantially identical manufactured objects;
   generating an electronic record, by a processor, for each of the plurality of substantially identical manufactured objects, including entering spatial locations of the plurality of non-conformances on the manufactured object detected by the detection apparatus into the electronic record for the manufactured object;
   calculating boundaries of an area containing the plurality of non-conformances on each of the plurality of substantially identical manufactured objects, using the electronic records and the processor; and
   displaying an electronic image of one of the plurality of substantially identical manufactured objects, including displaying simultaneously a plurality of boundary lines indicating the boundaries of all of the areas of all of the substantially identical manufactured objects in the plurality of substantially identical manufactured objects containing the plurality of non-conformances for all of the substantially identical manufactured objects in the plurality of substantially identical manufactured objects superimposed on the electronic image of the one of the plurality of substantially identical manufactured objects to allow simultaneous visualization of all of the areas of all of the substantially identical manufactured objects in the plurality of substantially identical manufactured objects containing the plurality of non-conformances for all of the substantially identical manufactured objects in the plurality of substantially identical manufactured objects.

15. The manufacturing method of claim 14, further comprising:
   modifying at least one process used to manufacture the plurality of substantially identical manufactured objects based on the boundary lines.

16. The manufacturing method of claim 14, further comprising:
   determining an area containing the non-conformances of all of the plurality of substantially identical manufactured objects based on the boundary lines displayed on the image; and
   reworking the non-conformances within the area.

17. The manufacturing method of claim 14, wherein entering spatial locations of non-conformances on the plurality of substantially identical manufactured objects includes entering coordinates of each of the non-conformances in a 3-D coordinate system of the plurality of substantially identical objects.

18. A system for tracking non-conformances of a plurality of aircrafts occurring during production, comprising:
   an electronic display for displaying a 3-D image of one aircraft in the plurality of aircrafts;
   an electronic file containing a 3-D model of the one aircraft;
   an input device configured to allow a user to input spatial locations of a plurality of non-conformances on each of the plurality of aircrafts;
   a programmed computer coupled with the electronic display, the electronic file and the input device; and
   a software program accessible by the computer, the software program including a routine for mapping the spatial locations of the plurality of non-conformances on each of the plurality of aircrafts in the 3-D model, a routine for using the spatial locations of the plurality of non-conformances to calculate boundaries of a 3-D area containing the plurality of non-conformances for each of the plurality of aircrafts, and a routine to display simultaneously the boundaries of all of the areas of all of the aircraft in the plurality of aircrafts containing the plurality of non-conformances for all of the aircraft in the plurality of the aircraft superimposed on the 3-D image of the one aircraft to allow simultaneous visualization of all of the areas of all of the aircraft in the plurality of aircrafts containing the plurality of non-conformances for all of aircraft in the plurality of aircrafts.

19. A method of mapping and visualizing non-conformances on a plurality of objects, comprising:
   for each object in the plurality of objects:
      determining, using a detection apparatus, a location of each of a plurality of non-conformances on the object;
      generating an electronic record, by a processor, containing spatial coordinates of the plurality of non-conformances within a 3-D coordinate system; and
      calculating boundaries, by the processor, of an area on the object containing the plurality of non-conformances based on the spatial coordinates contained in the electronic record;
   generating a 3-D electronic image of one object in the plurality of objects;
   displaying, on a display device, the boundaries of the areas containing the plurality of non-conformances for the plurality of objects superimposed on the 3-D electronic image of the one object to allow visualization of the areas containing the non-conformances for the plurality of objects; and
   calculating and displaying, on the display device, an outer boundary line of the boundaries of the areas containing the plurality of non-conformances on the plurality of objects combined.

20. The system of claim 18 A system for tracking non-conformances of a plurality of aircrafts occurring during production, comprising:
   an electronic display for displaying a 3-D image of one aircraft in the plurality of aircrafts;
   an electronic file containing a 3-D model of the one aircraft;
   an input device configured to allow a user to input spatial locations of a plurality of non-conformances on each of the plurality of aircrafts;

a programmed computer coupled with the electronic display, the electronic file and the input device; and a software program accessible by the computer, the software program including a routine for mapping the spatial locations of the plurality of non-conformances on each of the plurality of aircrafts in the 3-D model, a routine for using the spatial locations of the plurality of non-conformances to calculate boundaries of a 3-D area containing the plurality of non-conformances for each of the plurality of aircrafts, and a routine to display the boundaries of the areas containing the plurality of non-conformances for the plurality of the aircraft superimposed on the 3-D image of the one aircraft, wherein the software program further comprises a routine for calculating and displaying on the 3-D image of the one aircraft an outer boundary line of the boundaries of the areas containing the plurality of non-conformances on the plurality of aircrafts combined.

* * * * *